(12) United States Patent
Chen et al.

(10) Patent No.: US 8,823,452 B2
(45) Date of Patent: Sep. 2, 2014

(54) GM-RATIOED AMPLIFIER

(75) Inventors: Zhiming Chen, Singapore (SG); Foo Chung Choong, Singapore (SG); Yuanjin Zheng, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 176 days.

(21) Appl. No.: 13/636,916

(22) PCT Filed: Mar. 24, 2010

(86) PCT No.: PCT/SG2010/000112
§ 371 (c)(1),
(2), (4) Date: Nov. 26, 2012

(87) PCT Pub. No.: WO2011/119103
PCT Pub. Date: Sep. 29, 2011

(65) Prior Publication Data
US 2013/0207723 A1  Aug. 15, 2013

(51) Int. Cl.
*H03F 3/45* (2006.01)
*H03G 1/00* (2006.01)
*H03F 1/32* (2006.01)

(52) U.S. Cl.
CPC ........ *H03F 3/45179* (2013.01); *H03F 3/45183* (2013.01); *H03G 1/0029* (2013.01); *H03F 3/45475* (2013.01); *H03F 3/45* (2013.01); *H03F 3/45659* (2013.01); *H03F 2203/45646* (2013.01); *H03G 1/007* (2013.01); *H03F 1/3211* (2013.01)
USPC .......................................... 330/254; 330/258

(58) Field of Classification Search
CPC ........................................................ H03F 3/45
USPC ................................................. 330/252–261
See application file for complete search history.

(56) References Cited

U.S. PATENT DOCUMENTS

| 4,720,685 A | 1/1988 | Garuts |
| 5,436,594 A | 7/1995 | Pace et al. |

(Continued)

OTHER PUBLICATIONS

International Preliminary Report on Patentability for International Application No. PCT/SG2010/000112 dated Apr. 29, 2011.

(Continued)

*Primary Examiner* — Robert Pascal
*Assistant Examiner* — Khiem Nguyen
(74) *Attorney, Agent, or Firm* — Winstead, P.C.

(57) ABSTRACT

Embodiments provide a gm-ratioed amplifier. The gm-ratioed amplifier comprises a first input voltage terminal and a second input voltage terminal, a first output voltage terminal and a second output voltage terminal, and an amplifying unit. The amplifying unit may be coupled between the input voltage terminals and the output voltage terminals and may be adapted to supply an output voltage to the output terminals in dependence on an input voltage supplied to the input terminals. The amplifying unit may comprise a gm-load, which comprises a first load branch comprising a first field effect transistor, and a second load branch comprising a second field effect transistor. A first source/drain terminal and a gate terminal of the first field effect transistor may be coupled to the first output voltage terminal, and a first source/drain terminal and a gate terminal of the second field effect transistor may be coupled to the second output voltage terminal. A second source/drain terminal of the first field effect transistor and a second source/drain terminal of the second field effect transistor may be coupled with each other through a first transistor arrangement such that a linearity of response of the output voltage to the input voltage is improved.

21 Claims, 11 Drawing Sheets

(56) References Cited

U.S. PATENT DOCUMENTS

| | | | |
|---|---|---|---|
| 5,587,687 | A | 12/1996 | Adams |
| 5,621,358 | A | 4/1997 | Pisati et al. |
| 6,374,092 | B1 | 4/2002 | Leizerovich et al. |
| 6,509,796 | B2 | 1/2003 | Nguyen et al. |
| 6,542,019 | B1 | 4/2003 | Lim et al. |
| 6,700,444 | B2 | 3/2004 | Pengelly |
| 6,867,650 | B2 * | 3/2005 | Kimura .................. 330/254 |
| 6,870,425 | B2 | 3/2005 | Leifso et al. |
| 6,894,561 | B2 | 5/2005 | Apel |
| 2007/0188234 | A1 | 8/2007 | Beffa |

OTHER PUBLICATIONS

International Search Report and Written Opinion for International Application No. PCT/SG2010/000112 dated Jun. 9, 2010.

Tezcan et al., "Sloped Through Wafer vias for 3D Wafer Level Packaging," IEEE 2007 Electronic Components and Technology Conference, pp. 643-647.

Majeed et al., "Parylene N as a Dielectric Material for Through Silicon vias," IEEE 2008 Electronic Components and Technology Conference, pp. 1556-1561.

Tezcan et al., "Scalable Through Silicon via with Polymer Deep Trench Isolation for 3D Wafer Level Packaging," IEEE 2009 Electronic Components and Technology Conference, pp. 1159-1164.

Shen et al., "A Clamped Through Silicon via (TSV) Interconnection for Stacked Chip Bonding Using Metal Cap on Pad and Metal Column Forming in via," IEEE 2008 Electronic Components and Technology Conference, pp. 544-549.

Miranda et al., "Thermo-Mechanical Characterization of Copper Through-Wafer Interconnects," IEEE 2006 Electronic Components and Technology Conference, pp. 844-848.

Selvanayagam et al., "Nonlinear Thermal Stress/Strain Analyses of Copper Filled TSV (Through Silicon via) and their Flip-Chip Microbumps," IEEE 2008 Electronic Components and Technology Conference, pp. 1073-1081.

Knickerbocker et al., "Development of next-generation system-on-package (SOP) technology based on silicon carriers with fine-pitch chip interconnection," IBM J. Res. & Dev. vol. 49 No. 4/5 Jul./Sep. 2005, pp. 725-753.

Laviron et al., "Via First Approach Optimisation for Through Silicon via Applications," IEEE 2009 Electronic Components and Technology Conference, pp. 14-19.

Yan Jiangnan, "A CMOS DB-Linear VGA with DC Offset Cancellation for Direct-Conversion Receiver," Thesis submitted for the Degree of Master of Engineering, National University of Singapore, 2005.

* cited by examiner

*900*

Number of cases for comparison

| VGA number | Input stage | gm load | Classification |
|---|---|---|---|
| #1 | No degeneration | No degeneration | Conventional |
| #2 | No degeneration | Degenerated | This invention |
| #3 | Degenerated | No degeneration | Conventional |
| #4 | Degenerated | Degenerated | This invention |

GM-RATIOED AMPLIFIER

CROSS REFERENCES TO RELATED APPLICATIONS

The present application is a U.S. National Stage Application under 35 U.S.C. §371 of International Application No. PCT/SG2010/000112, filed on Mar. 10, 2010, the complete disclosure of which is incorporated herein by reference.

FIELD OF INVENTION

Various embodiments relate generally to an electronic gm-ratioed amplifier.

BACKGROUND

A gm-ratioed amplifier generally refers to an amplifier whose gain is determined by the ratio of the input transconductance (gm) and load transconductance (gm), wherein the gain is a measure of the ability of the amplifier to increase the power or amplitude of an input signal. The term "gm-ratioed" in this context means transconductance ratioed. That is, at a certain ratio of the input transconductance and load transconductance, the gm-ratioed amplifier may have a fixed gain for small input signals, and by varying the ratio of the input transconductance and load transconductance of the gm-ratioed amplifier, the gain of the gm-ratioed amplifier may be varied accordingly. For example, the ratio of the input transconductance and the load transconductance may be controlled by varying the currents through the transconductance stages (e.g. input stage and load stage) of the gm-ratioed amplifier.

In many applications, linearity is required to be preserved during the amplification of a signal such that a minimum amount of distortion is introduced. In this context, the linearity may refer to the linearity of response of an output signal to an input signal. For example, the input signal may be an input voltage and the output signal may be an output voltage, as is the case for a voltage amplifier. As another example, the input signal may be an input current and the output signal may be an output current, as is the case for a current amplifier. In a further example, the input signal may be an input voltage and the output signal may be an output current, as is the case for a transconductance amplifier. In a still further example, the input signal may be an input current and the output signal may be an output voltage, as is the case for a transimpedance amplifier. In other words, linearity is the behavior that an output signal strength varies in direct proportion to the input signal strength. For example, an amplifier is considered to have a behavior of linearity when the output voltage varies in direct proportion to the input voltage. That is, the output-to-input signal strength ratio remain the same when the amplifier exhibits linearity. Accordingly, when an amplifier exhibits linearity, the gain of the amplifier in decibels (dB) remains to be a constant. The linearity preserves signal shape such that signal correlation properties are protected or information of the edges remains undistorted.

In many designs, the linearity of a gm-ratioed amplifier is achieved at a price of power consumption.

SUMMARY OF THE INVENTION

Various embodiments provide a gm-ratioed amplifier which may achieve an improved output linearity while maintaining approximately the same power consumption. Further, improvement in the input linearity or higher gain may be obtained.

Various embodiments provide a gm-ratioed amplifier. The gm-ratioed amplifier may comprise a first input voltage terminal and a second input voltage terminal, a first output voltage terminal and a second output voltage terminal, and an amplifying unit. The amplifying unit may be coupled between the input voltage terminals and the output voltage terminals and may be adapted to supply an output voltage to the output terminals in dependence on an input voltage supplied to the input terminals. The amplifying unit may comprise a gm-load, which comprises a first load branch comprising a first field effect transistor, and a second load branch comprising a second field effect transistor. A first source/drain terminal and a gate terminal of the first field effect transistor may be coupled to the first output voltage terminal. A first source/drain terminal and a gate terminal of the second field effect transistor may be coupled to the second output voltage terminal. A second source/drain terminal of the first field effect transistor and a second source/drain terminal of the second field effect transistor may be coupled with each other through a first transistor arrangement such that a linearity of response of the output voltage to the input voltage is improved.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
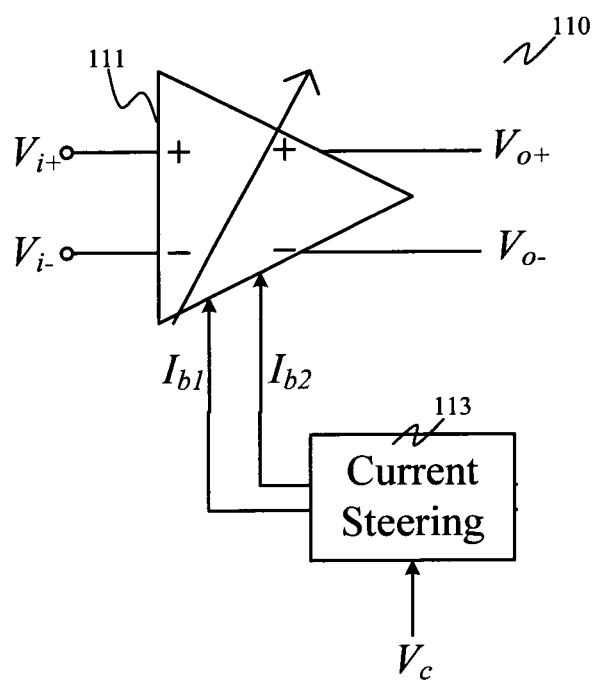
FIG. 1 (a) shows the block diagram of a one-stage variable gain amplifier (VGA), and FIG. 1 (b) shows the block diagram of a two-stage variable gain amplifier (VGA)
Figure 1:
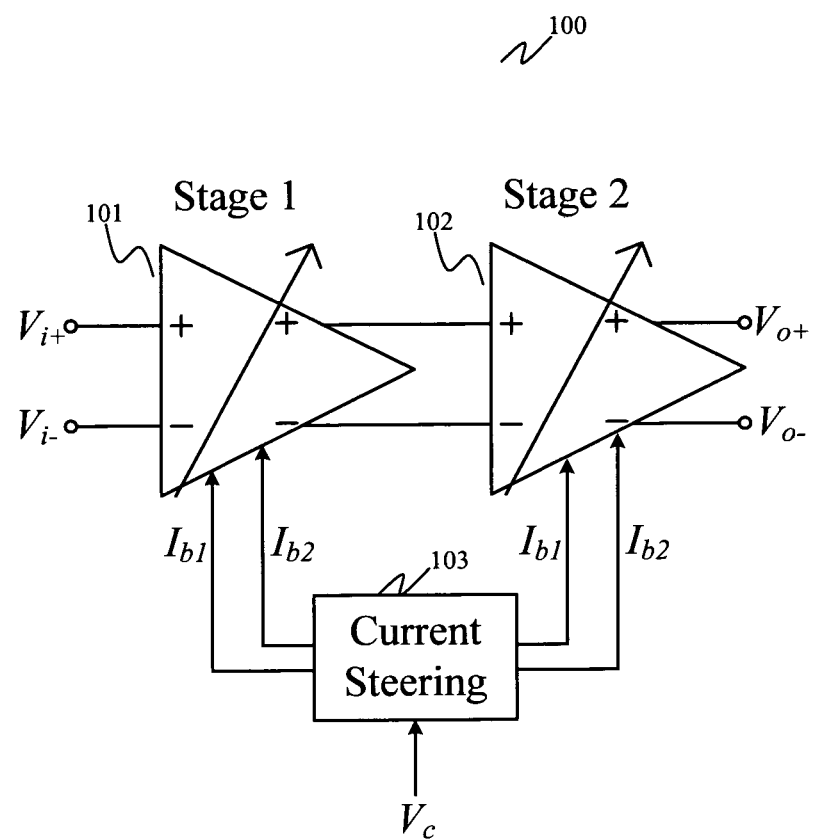

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. The following detailed description therefore, is not to be taken in a limiting sense, and the scope of the present invention is defined by the appended claims.

The word "exemplary" is used herein to mean "serving as an example, instance, or illustration". Any embodiment or design described herein as "exemplary" is not necessarily to be construed as preferred or advantageous over other embodiments or designs.

Generally, a gm-ratioed amplifier refers to an amplifier whose output is coupled with a load, and whose gain is determined by the ratio of the input transconductance (gm) and load transconductance (gm). The input transconductance may be realized by using a source-coupled pair, e.g. two transistors with their source terminals connected together and a current source connected to the two source terminals of the source-coupled transistors, like transistors M5 and M6 and current source 252 shown in FIG. 2. The load transconductance may be realized similarly to the input transconductance with the transistors' gate and drain terminals connected. A pair of PMOS transistors may be required to source current to both the input transconductance and load transconductance, like transistors M7 and M8 in FIG. 2. For a differential amplifier, a common-mode feedback (CMFB) circuit may be required to fix the output common-mode level.

The gm-load in this context refers to a load whose impedance is the reciprocal of a transconductance (gm). One possible realization is the source-couple pair with diode connections. The source-coupled pair refers to a pair of transistors whose source terminals are connected together, like transistor M1 and M2, or M5 and M6 shown in FIG. 2. The diode connection refers to a transistor whose gate and drain terminals are connected together.

The output linearity refers to the output signal level (in voltage or dBm) at which the amplifier just starts to deviate from the linear operation behavior (typically defined by the point when gain is dropped by 1 dB). Similarly, the input linearity refers to the input signal level (in voltage or dBm) at which the amplifier just starts to deviate from the linear operation behavior.

Embodiments provide a gm-ratioed amplifier which may improve the linearity of the amplifier while maintaining the same power consumption.

The gm-ratioed amplifier may comprise a first input voltage terminal and a second input voltage terminal. The gm-ratioed amplifier may further comprise a first output voltage terminal and a second output voltage terminal. In one embodiment, the gm-ratioed amplifier may further comprise an amplifying unit being coupled between the input voltage terminals and the output voltage terminals and being adapted to supply an output voltage to the output voltage terminals in dependence on an input voltage supplied to the input voltage terminals. The amplifying unit may comprise a gm-load. In one embodiment, the gm-load may comprise a first load branch which comprises a first field effect transistor. The gm-load may comprise a second load branch which comprises a second field effect transistor. In one embodiment, a first source/drain terminal and a gate terminal of the first field effect transistor may be coupled to the first output voltage terminal. In one embodiment, a first source/drain terminal and a gate terminal of the second field effect transistor may be coupled to the second output voltage terminal. In one embodiment, a second source/drain terminal of the first field effect transistor and a second source/drain terminal of the second field effect transistor may be such coupled with each other through a first transistor arrangement that a linearity of response of the output voltage to the input voltage is improved.

The gm-load may be a block of circuit being coupled between the output terminals of the gm-ratioed amplifier and a ground, for example.

In one embodiment, the first transistor arrangement may comprise a third field effect transistor and a fourth field effect transistor. The gate terminal of the first field effect transistor may be coupled to a gate terminal of the third field effect transistor. The gate terminal of the second field effect transistor may be coupled to a gate terminal of the fourth field effect transistor. In one embodiment, a first source/drain terminal of the third field effect transistor and a first source/drain terminal of the fourth field effect transistor may be coupled to the second source/drain terminal of the first field effect transistor. A second source/drain terminal of the third field effect transistor and a second source/drain terminal of the fourth field effect transistor may be coupled to the second source/drain terminal of the second field effect transistor.

In one embodiment, the amplifying unit may further comprise a fifth field effect transistor and a sixth field effect transistor. A gate terminal of the fifth field effect transistor may be coupled to the first input voltage terminal. A gate terminal of the sixth field effect transistor may be coupled to the second input voltage terminal. A first source/drain terminal of the fifth field effect transistor may be coupled to the first output voltage terminal. A first source/drain terminal of the sixth field effect transistor may be coupled to the second output voltage terminal. A second source/drain terminal of the fifth field effect transistor may be coupled with a second source/drain terminal of the sixth field effect transistor.

In one embodiment, the gm-ratioed amplifier may further comprise a first resistor. The first resistor may have a first resistor terminal and a second resistor terminal. The first resistor terminal of the first resistor may be coupled to a first reference voltage. The second resistor terminal of the first resistor may be coupled to the first output voltage terminal. The gm-ratioed amplifier may further comprise a second resistor. The second resistor may have a first resistor terminal and a second resistor terminal. The first resistor terminal of the second resistor may be coupled to the first reference voltage. The second resistor terminal of the second resistor may be coupled to the second output voltage terminal.

In a further embodiment, the first resistor may be a seventh field effect transistor. The seventh field effect transistor may have a first source/drain terminal being coupled to the first reference voltage. The seventh field effect transistor may have a second source/drain terminal being coupled to the first output voltage terminal. The second resistor may be an eighth field effect transistor. The eighth field effect transistor may have a first source/drain terminal being coupled to the first reference voltage. The eighth field effect transistor may further have a second source/drain terminal being coupled to the second output voltage terminal. In one embodiment, a gate of the seventh field effect transistor may be coupled to a gate of the eighth field effect transistor. For example, the first reference voltage may be a power supply voltage.

In one embodiment, the gm-ratioed amplifier may further comprise a common-mode feedback (CMFB) circuit. In one embodiment, the CMFB circuit may have a first feedback input terminal being coupled to the first output voltage terminal. The CMFB circuit may have a second feedback input terminal being coupled to the second output voltage terminal. The CMFB circuit may have a feedback output terminal being coupled to a junction between the gates of the seventh and eighth field effect transistors. Generally, the CMFB circuit may stabilize common-mode voltages. Common-mode voltages of a differential output refers to the average of the differential output signal, e.g. differential output voltage. The output differential voltage supplied by the first and the second output voltage terminals to the first and the second feedback input terminals may be averaged and compared with a common-mode reference voltage. The differential voltage may be converted by the CMFB circuit to a feedback signal, e.g. a feedback voltage, and the feedback signal may be output via the feedback output terminal of the CMFB circuit. It is understood that the CMFB circuit is generally well-known in the art and any existing CMFB circuit that is suitable to be used in the gm-ratioed amplifier may be put into the gm-ratioed amplifier circuit.

In one embodiment, the first load branch of the gm-load may further comprise a first current source being coupled between a second reference voltage and the second source/drain terminal of the first field effect transistor. The first current source may be configured to provide a first current. The second load branch of the gm-load may further comprise a second current source being coupled between the second reference voltage and the second source/drain terminal of the second field effect transistor. The second current source may be configured to provide a second current. In one embodiment, the first current is the same or approximately equal to the second current. For example, the second reference voltage may be a ground voltage.

In one embodiment, the amplifying unit may further comprise a third current source being coupled between the second reference voltage and a junction of the second source/drain terminals of the fifth and sixth field effect transistors. The third current source may be configured to provide a third current.

In an alternate embodiment of the embodiment wherein a third current source is, provided and the second source/drain terminal of the fifth field effect transistor is directly coupled to the second source/drain terminal of the sixth field effect transistor, the second source/drain terminal of the fifth field effect transistor may be coupled with the second source/drain terminal of the sixth field effect transistor through a second transistor arrangement. The second transistor arrangement may comprise a ninth field effect transistor and a tenth field effect transistor. The gate terminal of the fifth field effect transistor may be coupled to a gate terminal of the ninth field effect transistor. The gate terminal of the sixth field effect transistor may be coupled to a gate terminal of the tenth field effect transistor. A first source/drain terminal of the ninth field effect transistor and a first source/drain terminal of the tenth field effect transistor may be coupled to the second source/drain terminal of the fifth field effect transistor. A second source/drain terminal of the ninth field effect transistor and a second source/drain terminal of the tenth field effect transistor may be coupled to the second source/drain terminal of the sixth field effect transistor. In one embodiment, the amplifying unit may further comprise a fourth current source being coupled between the second reference voltage and the second source/drain terminal of the fifth field effect transistor. The fourth current source may be configured to provide a fourth current. The amplifying unit may further comprise a fifth current source being coupled between the second reference voltage and the second source/drain terminal of the sixth field effect transistor. The fifth current source may be configured to provide a fifth current. The fourth current may be same or approximately equal to the fifth current.

In one embodiment, the first through the sixth field effect transistors are N-channel field effect transistors. For example, the first through the sixth field effect transistors are N-channel metal oxide semiconductor field effect transistors (NMOSFET). In one embodiment, the seventh and the eighth field effect transistors are P-channel field effect transistors. For example, the seventh and the eighth field effect transistors are P-channel metal oxide semiconductor field effect transistors (PMOSFET). In one embodiment, the first reference voltage is a power supply voltage, and the second reference voltage is a ground voltage.

In an alternative embodiment of the embodiment wherein the first through sixth field effect transistors are N-channel field effect transistors and the seventh and the eighth field effect transistors are P-channel field effect transistors, the first through the sixth field effect transistors are P-channel field effect transistors, e.g. P-channel metal oxide semiconductor field effect transistors (PMOSFET), and the seventh and the eighth field effect transistors may be N-channel field effect transistors, e.g. N-channel metal oxide semiconductor field effect transistors (NMOSFET). In this alternative embodiment, the first reference voltage is a ground voltage, and the second reference voltage is a power supply voltage.

In one embodiment, the first through sixth field effect transistors are of a different type of transistors (in respect of channel type) from the seventh and eighth field effect transistors.

In one embodiment, the ninth and the tenth field effect transistors are N-channel field effect transistors. For example, the ninth and the tenth field effect transistors are N-channel metal oxide semiconductor field effect transistors (NMOSFET). In one embodiment, the ninth and tenth field effect transistors are of the same type (in respect of channel type, e.g. N-channel or P-channel) with the first through sixth field effect transistors. In one embodiment, the ninth and tenth field effect transistors are of a different type (in respect of channel type, e.g. N-channel or P-channel) from the seventh and eighth field effect transistors.

In one embodiment, the first field effect transistor and the second field effect transistor have the same or approximately the same aspect ratio.

In one embodiment, the third field effect transistor and the fourth field effect transistor have the same or approximately the same aspect ratio.

In one embodiment, the third and the fourth field effect transistors are configured to operate in a triode region.

In one embodiment, the ninth and the tenth field effect transistors have the same or approximately the same aspect ratio.

In one embodiment, the ninth and the tenth field effect transistors are configured to operate in a triode region.

The accompanying drawings mentioned hereafter and the detailed explanations that follow will serve as an illustration to better aid in the understanding of the various non-limiting embodiments of the present invention.

A gm-ratioed amplifier may be used in conjunction with a current steering circuit to realize the function of variable gain amplifier (VGA), an example for which is described in relation to FIG. 1. A variable-gain amplifier (VGA) is an electronic amplifier that may vary its gain depending on the amplitude of a control signal (e.g. a control voltage). A VGA is a common block for wireless communication systems, typically employed in a receiver and used in conjunction with an automatic-gain control (AGC) algorithm. After the front-end of the receiver which may include a low-noise amplifier (LNA) achieves a sufficient noise figure, the VGA plays an important part in amplifying a signal to an appropriate, amplitude for further processing, e.g., to be converted into digital signal using an analogue-to-digital converter (ADC).

It should be noted that a gm-ratioed amplifier is not limited to be used for a VGA. For example, the gm-ratioed amplifier may be used for a limiting amplifier or an output buffer.

FIG. 1 (a) illustrates the block diagram of a one-stage variable gain amplifier 110. As can be seen, the VGA 110 only comprises one stage 111. The VGA 110 comprises a variable gain amplification stage 111. In other words, the stage 111 is a VGA gain cell (circuit) providing an amplification of the respective input signal. For example, the gain cell may be a gm-ratioed amplifier. As can be seen, the VGA 110 further comprises a current steering circuit 113. The current steering circuit 113 may be configured to output a current $I_{b1}$ to the input stage of the gain cell 111, and to output a current $I_{b2}$ to the load stage of the gain cell 111. To ensure continuous gain control without any glitch, a dB-linear transfer function may be implemented. For example, a control voltage $V_c$ may be used by the current steering circuit 113 to steer the currents $I_{b1}$ and $I_{b2}$ going to the VGA gain cell 111 to realize dB-linear transfer function. More specifically, through the current steering circuit 113, a linear change in the control voltage $V_c$ may result in exponential change in the ratio of current $I_{b1}$ and current $I_{b2}$. Subsequently, as the gain of the VGA gain cell 111 (gm-ratioed amplifier) is determined by the ratio of the input stage transconductance and load transconductance, the gain of the VGA 110 may change exponentially corresponding to the linear change in the control voltage $V_c$.

FIG. 1 (b) illustrates the block diagram of a two-stage variable gain amplifier (VGA) 100. The VGA 100 comprises a first variable gain amplification stage 101 and a second variable gain amplification stage 102. In other words, each stage is a VGA gain cell (circuit) providing an amplification of the respective input signal. For example, each gain cell may be a gm-ratioed amplifier. The gain cells 101 and 102 are connected in cascade, i.e. the output of the first gain cell 101 is connected to form the input of the second gain cell 102. It is well understood in the art that usually more than one stage is used in a VGA to accommodate the wide dynamic range of amplification required in wireless communications, and the number of stages in the VGA may be varied depending on the requirement of the circuit. Generally the overall gain is the product of the gains of the individual gain cells. In this example relating to FIG. 1 (b), the overall gain is the product of the gains of the gain cells 101 and 102. If the gain of each gain cell is expressed in decibels (dB), the total gain is the sum of the gains of gain cells.

As can be seen, the VGA 100 further comprises a current steering circuit 103. The current steering circuit 103 may be configured to output a current $I_{b1}$ to each of the input stage of the gain cells 101 and 102, and to output a current $I_{b2}$ to each of the load stage of the gain cells 101 and 102. To ensure continuous gain control without any glitch, a dB-linear transfer function may be implemented. For example, a control voltage $V_c$ may be used by the current steering circuit 103 to steer the currents $I_{b1}$ and $I_{b2}$ going to the VGA gain cells 101 and 102 to realize dB-linear transfer function. More specifically, through the current steering circuit 103, a linear change in the control voltage $V_c$ may result in exponential change in the ratio of current $I_{b1}$ and current $I_{b2}$. Subsequently, as the gain of each of the VGA gain cells 101 and 102 (gm-ratioed amplifier) is determined by the ratio of the input stage transconductance and load transconductance, the gain of the VGA 100 may change exponentially corresponding to the linear change in the control voltage $V_c$.

To reduce complexity and therefore power consumption, a smaller number of stages in a receiver chain and hence in each VGA is preferred. The number of stages may be reduced if the gain in each stage may be increased. For a gm-ratioed amplifier which may be used in a VGA, one approach to realize the function of variable gain is to change the input stage transconductance gm and the load transconductance. To achieve a large gain range, an exponential function or a pseudo exponential function is commonly used in a variable-gain amplifier (VGA), i.e., a linear change in the analogue or digital control signal results in an exponential change in the VGA gain. In other words, if the gain is expressed in decibels (dB), a linear change in the analogue or digital control signal may result in a linear change of the VGA gain in decibels (dB). A VGA is called to be dB-linear VGA when the gain of the VGA changes exponentially (linearly in dB) corresponding to a linear change in the control signal.

Figure 2:
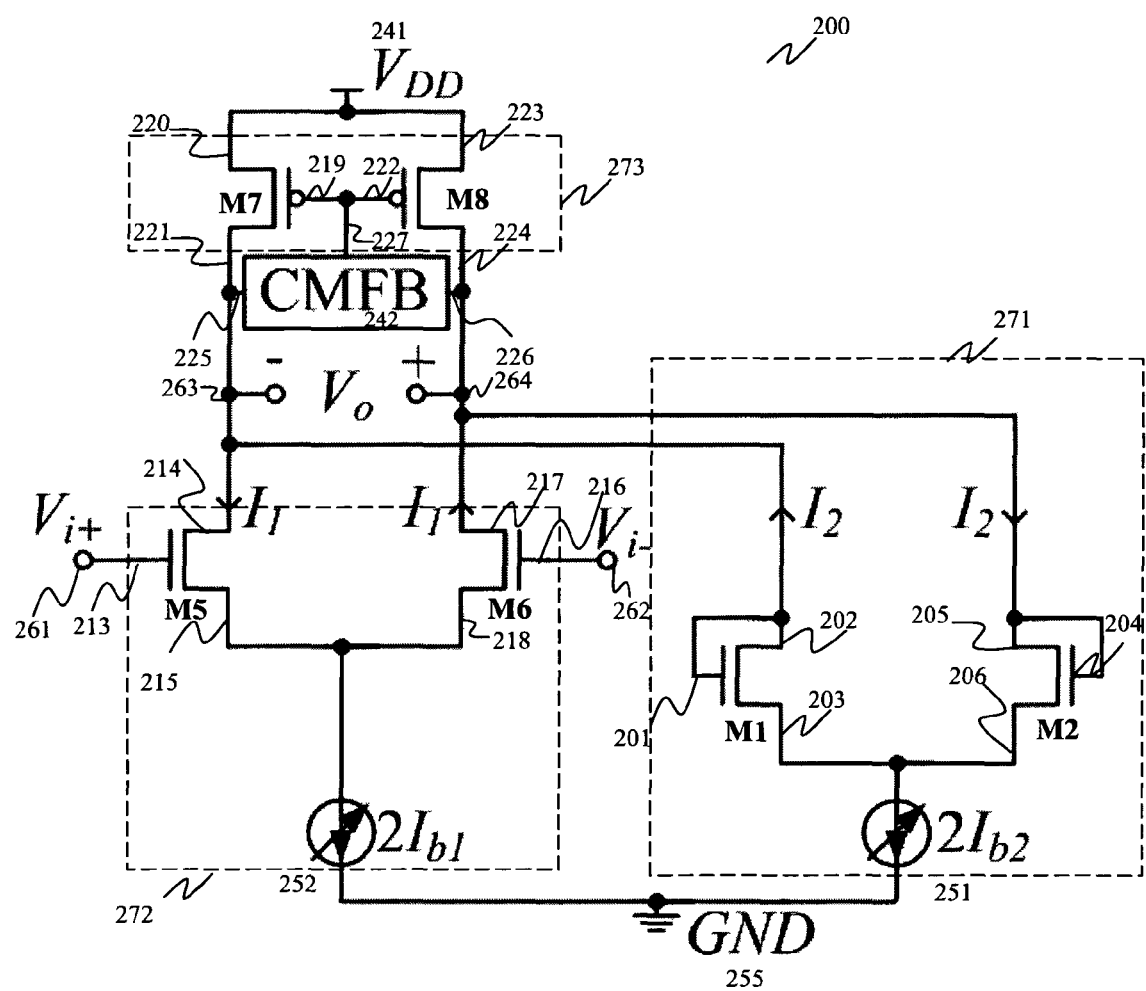
FIG. 2 shows the circuit diagram of one conventional gm-ratioed amplifier that may be used for a variable gain amplifier (VGA)

FIG. 2 illustrates the circuit diagram of the circuit 200 of a conventional gm-ratioed amplifier for a variable-gain amplifier (VGA) which may realize the exponential function of the VGA gain (i.e. linear function of the VGA gain in dB) upon linear change of a control signal by adopting a gm load, and manipulating the input and load gin current and subsequently the transconductance. For example, the circuit 200 of the gm-ratioed amplifier may be used in the gain cell 111 shown in FIG. 1 (a). Similarly, the circuit 200 of the gm-ratioed amplifier may be used in any of the gain cells 101 and 102 shown in FIG. 1 (b). The control signal $V_c$ in FIG. 1 (a) may steer currents in the current steering circuit 113 such that a linear change in control voltage $V_c$ corresponds to an exponential change in the current ratios of currents $I_{b1}$ and $I_{b2}$ as shown in FIG. 1 (a). The currents $I_{b1}$ and $I_{b2}$ shown in FIG. 1 (a) may be mirrored in the gain cell (gm-ratioed amplifier) 111 which has a circuit 200 as shown in FIG. 2. That is, the current $I_{b1}$ is mirrored in the current source 252 in FIG. 2, and the current $I_{b2}$ is mirrored in the current source 251 in FIG. 2. With an exponential change in the ratio of currents $I_{b1}$ and $I_{b2}$ in FIG. 1, the ratio of input transconductance and load transconductance may change exponentially accordingly. As a result, a linear change in the control voltage $V_c$ may correspond to an exponential change in the gain of each of the gm-ratioed amplifier, which is determined by the ratio of the input transconductance and load transconductance of the gm-ratioed amplifier.

As can be seen, the circuit 200 comprises a first input voltage terminal 261 and a second input voltage terminal 262. The circuit 200 further comprises a first output voltage terminal 263 and a second output voltage terminal 264. The circuit 200 further comprises an amplifying unit being adapted between the input voltage terminals 261 and 262 and the output voltage terminals 263 and 264. The amplifying unit comprises an input stage which is represented by the circled area 272. The amplifying unit further comprises a gm-load, which is the part of circuit 200 in the circled area 271. The gm-load is coupled between the output voltage terminals 263 and 264 and a ground 255, and is a load whose impedance is the reciprocal of a transconductance (gm). The gm-load comprises a first load branch which comprises a field effect transistor M1 and a second load branch which comprises a field effect transistor M2. A gate terminal 201 and a first source/drain terminal 202 of the field effect transistor M1 are coupled with the first output voltage terminal 263. A gate terminal 204 and a first source/drain terminal 205 of the field effect transistor M2 are coupled with the second output voltage terminal 264. The amplifying unit may further comprise field effect transistors M5 and M6 in the input stage, wherein a gate 213 of the field effect transistor M5 is coupled with the first input voltage terminal 261 and a gate 216 of the field effect transistor M6 is coupled with the second input voltage terminal 262. A first source/drain terminal 214 of the field effect transistor M5 is coupled with the first output voltage terminal 263, and a first source/drain terminal 217 of the field effect transistor M6 is coupled with the second output voltage terminal 264.

The circuit 200 further comprises field effect transistors M7 and M8, wherein a gate 219 of the field effect transistor M7 is coupled with a gate 222 of the field effect transistor M8, and a first source/drain terminal 220 of the field effect transistor M7 and a first source/drain terminal 223 of the field effect transistor M8 are coupled with a power supply 241 ($V_{DD}$). A second source/drain terminal 221 of the field effect transistor M7 is coupled with the first output voltage terminal 263, and a second source/drain terminal 224 of the field effect transistor M8 is coupled with the second output voltage terminal 264. Field effect transistors M7 and M8 as represented in the circled box 273 may be referred to as active load in the circuit 200. In this context, the active load refers to the load which is made of active devices, e.g. MOSFET transistors. The active load is contrary to the passive load which may be passive devices like a resistor or a capacitor. The active load may function high impedance paths to the supply voltage VDD 241 and source current to the input transconductance and load transconductance.

The circuit 200 further comprises a common mode feedback circuit (CMFB) 242, wherein a first feedback input terminal 225 of the CMFB 242 is coupled with the first output voltage terminal 263, a second feedback input terminal 226 is coupled with the second output voltage terminal 264, and a feedback output terminal 227 of the CMFB 242 is coupled with a junction between the gate 219 of the field effect transistor M7 and the gate 222 of the field effect transistor M8. The circuit 200 may further comprise a current source 251 being coupled between the ground 255 and a junction between a second source/drain terminal 203 of the field effect transistor M1 and a second source/drain terminal 206 of the field effect transistor M2. The circuit 200 may further comprise a current source 252 being coupled between the ground 255 and a junction between a second source/drain terminal 215 of the field effect transistor M5 and a second source/drain terminal 218 of the field effect transistor M6. As mentioned earlier, for example, the current through the current source 252 and the current through the current source 251 may be mirrored from the currents $I_{b1}$ and $I_{b2}$ from the current steering circuit 113 (see FIG. 1 (a)), respectively. The field effect transistors M7 and M8 may be P-channel field effect transistors. For example, the transistors M7 and M8 may be P-channel metal oxide semiconductor field effect transistors (PMOSFET). The field effect transistors M1, M2, M5, and M6 may be N-channel field effect transistors. For example, the field effect transistor M1, M2, M5, and M6 may be N-channel metal oxide semiconductor field effect transistors (NMOSFET).

Though theoretically the gm-ratioed amplifier as shown in FIG. 2 may achieve a good linearity at some particular point of input-load gm steering where distortions generated by the input stage and the load stage almost completely cancel each other, it may be limited by PMOS and the common-mode feedback (CMFB). That is, when the output signal is small, the PMOS transistors operate relatively in a linear region and is not the dominant contributor of nonlinearity. However, when the output signal swing is large enough, the PMOS and common mode feedback circuit might be pushed into the non-linear region and contribute a significant amount of distortion. At some particular point of input-load gm steering the gm-ratioed amplifier in FIG. 2 may achieve good linearity where distortions generated by the input and load stages almost completely cancel each other. However, at most points of input-load gm steering, distortion generated by the input and load stages could not cancel each other, resulting in poor output linearity performance. The poor linearity performance of gm-ratioed amplifier may be derived as follows, although, no theoretical analysis is performed yet.

Generally, for a gm stage, e.g. the input stage, the I-V can be described as $$I_1 = a_1 V_{in} + a_2 V_{in}^2 + a_3 V_{in}^3 \qquad (1)$$

where $I_1$ is the current through the first source/drain terminal 214 of the field effect transistor M5 in the circuit 200 (or the current through the first source/drain terminal 217 of the field effect transistor M6 in the circuit 200), the $a_1$, $a_2$, and $a_3$ are the coefficients of the fundamental, second and third order harmonics, respectively. Here the DC component is not included and the harmonics are taken into account up to the third order. One can obtain that $a_2$ is zero. The differential input voltage $V_{in} = V_{i+} - V_{i-}$. Memory effects of parasitic capacitors present in the circuit may not be considered for relatively low frequency applications up to a few hundreds of mega Hz. Therefore, the Taylor series, rather than Volterra series, is sufficient for calculation.

Therefore, the output voltage of the gm-ratioed amplifier may be obtained as $$V_o = -1 \times I_1 \frac{1}{g_{moL} + g_{0in} + g_{pL}} \approx -1 \times I_1 \frac{1}{g_{moL}} \qquad (2)$$

where $g_{moL}$ is the transconductance for the gm-load (the circuit part in the circled box 271 in the circuit 200 in FIG. 2), $g_{0in}$ is the output transconductance of the input stage (the circuit part in the circled box 272 in the circuit 200 in FIG. 2), and $g_{pL}$ is the load transconductance due to the PMOS active load (the circuit part in the circled dotted box 273). In other words, referring to FIG. 2, the gm-load refers to the part of circuit 200 which comprises the first load branch and the second load branch wherein the first load branch comprises the field effect transistor M1 and the second load branch comprises the field effect transistor M2. The gm-load further comprises the current source 251. The input stage refers to the part of circuit 200 which comprises the field effect transistors M5 and M6 and the current source 252. The PMOS active load refers to the part of the circuit 200 which comprises the field effect transistors M7 and M8.

Contributions from $g_{0in}$ and $g_{pL}$ are negligible, as compared with the transconductance of the gm-load $g_{moL}$. Therefore, $g_{0in}$ and $g_{pL}$ may be neglected for the ease of calculation. The contribution from the gm-load may be expressed as $$g_{moL} = \frac{\partial I_2}{\partial V_o} = b_1 + 2b_2 V_o + 3b_3 V_o^2 + 4b_4 V_o^3 \qquad (3)$$

where $b_n$ are the nth harmonic coefficient of the gm-load V-I relationship, respectively, and $I_2$ is the current through the first source/drain terminal 202 of the field effect transistor M1 (or the current through the first source drain terminal 205 of the field effect transistor M2). The current through the gate terminal 201 of the field effect transistor M1 and the current through the gate terminal 204 of the field effect transistor M2 are negligible in this calculation. It may be proven that coefficients $b_2$ and $b_4$ are zero. Therefore, $$V_o \approx -\frac{I_1}{b_1 + 3b_3 V_o^2} \qquad (4)$$

Combining equations (1) and (4), the expression of $V_o$ in terms of $V_{in}$ up to the third order can be obtained as $$V_o \approx c_1 V_{in} + c_2 V_{in}^2 + c_3 V_{in}^3 \quad (5)$$

where $$c_1 = -\frac{a_1}{b_1} \quad (6.1)$$

$$c_2 = 0 \quad (6.2)$$

$$c_3 = -\frac{1}{b_1^4}(-3b_3 a_1^3 + a_3 b_1^3) \quad (6.3)$$

The input transistor transconductance (transconductance of each of the field effect transistors M5 and M6 in FIG. 2) may be denoted as $g_{ma}$ and small-signal parameter of each of the transistors M5 and M6 in FIG. 2 may be denoted as $K_a = 0.5 \mu_n C_{ox}(W/L)_a$, wherein $\mu_n$ is the electron mobility in the channel of the field effect transistor, $C_{ox}$ is the capacitance per unit area of the parallel-plate capacitor formed by the gate electrode and the channel, and W/L is the aspect ratio of the channel width W to the channel length L of the field effect transistor. For the load, the transconductance and the small-signal parameter of each of the field effect transistors M1 and M2 may be denoted as $g_{mb}$ and $K_b = 0.5 \mu_n C_{ox}(W/L)_b$, respectively. It can be seen that in this illustrating example, it is assumed that the field effect transistors M1, M2, M5 and M6 are N-channel field effect transistors (e.g. NMOSFET). One can obtain $$\sqrt{\left|\frac{c_1}{c_3}\right|} = \sqrt{\left|\frac{-8 \frac{g_{ma}^2}{K_a^2}}{-3\left(\frac{g_{ma}}{g_{mb}}\right)^4 \times \left(\frac{K_b}{K_a}\right)^2 + 1}\right|} \quad (6.4)$$

The input P1dB may be obtained as $$P_{in1dB,1} = 20\log_{10}\sqrt{\left|\frac{c_1}{c_3}\right| \times 0.145} \quad (7)$$

and output P1dB as $$P_{out1dB,1} = P_{in1dB,1} + A_{v,1} \quad (8)$$

where $A_{v,1}$ is the voltage gain in dB. Generally, an amplifier remains a constant gain in dB at low-level input signals (i.e. the amplifier exhibits linearity of response of the output signal (e.g. output voltage signal) to the input signal (e.g. input voltage signal)), and at higher-level input signals, the gain of the amplifier decreases. P1dB refers to the 1 dB compression point wherein the input signal is amplified 1 dB less than the small signal gain. Input P1dB refers to the input power in dBm at the 1 dB compression point, and output P1dB refers to the output power in dBm at the 1 dB compression point. Input P1dB and output P1dB may be used as an indicator for input linearity and output linearity, respectively. A relatively larger value of the input P1dB or output P1dB indicates a relatively better input linearity or output linearity.

Figure 3:
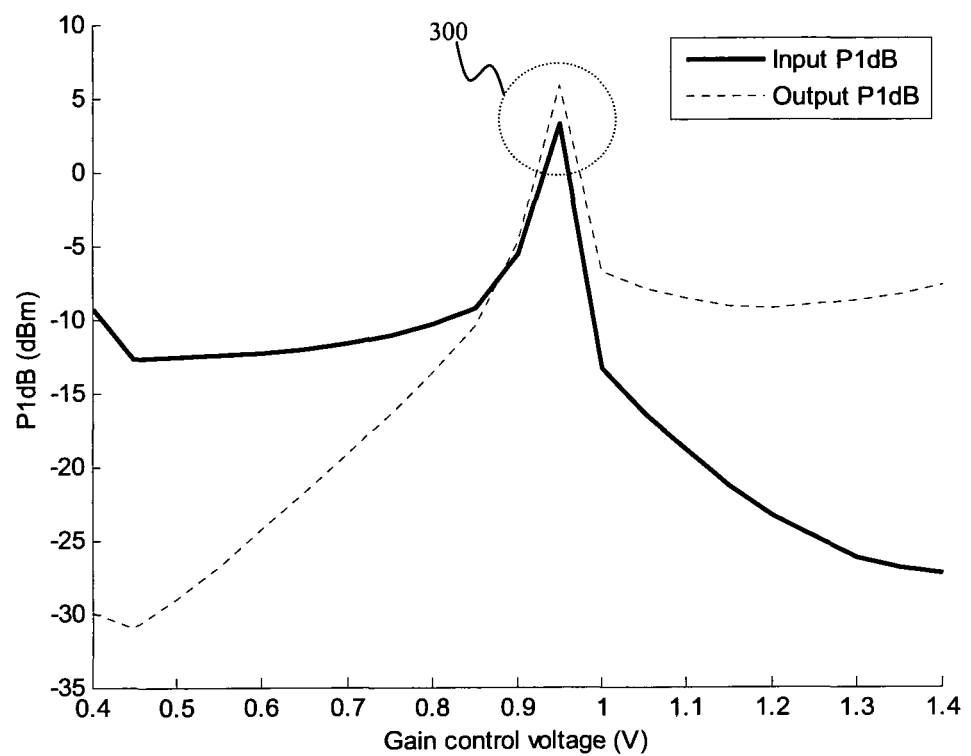
FIG. 3 shows the input P1dB and output P1dB at various VGA gain settings for a conventional one-stage VGA which comprises a gm-ratioed amplifier having the circuit as shown in FIG. 2.

FIG. 3 shows the input and output P1dB plots that one can obtain theoretically for a conventional one-stage VGA which comprises a gm-ratioed amplifier having a circuit as shown in FIG. 2. The solid line in the FIG. 3 represents the input P1dB at various gain settings, and the dotted line in FIG. 3 represents the output P1dB at various gain settings. The gain setting is the control voltage, e.g. the control voltage $V_c$ as shown in FIG. 1 (a). As described earlier, by controlling the control voltage $V_c$, the ratio of the input transconductance and the load transconductance of the gm-ratioed amplifier may be varied, thereby varying the gain of the respective gm-ratioed amplifier. As can be seen from FIG. 3, at some particular gain setting, distortions from the input stage and gm-load almost completely cancel each other, resulting in a relatively good linearity (e.g. region 300 in FIG. 3). However, over the entire gain range, the VGA linearity drops drastically, leading to poor performance.

Figure 4:
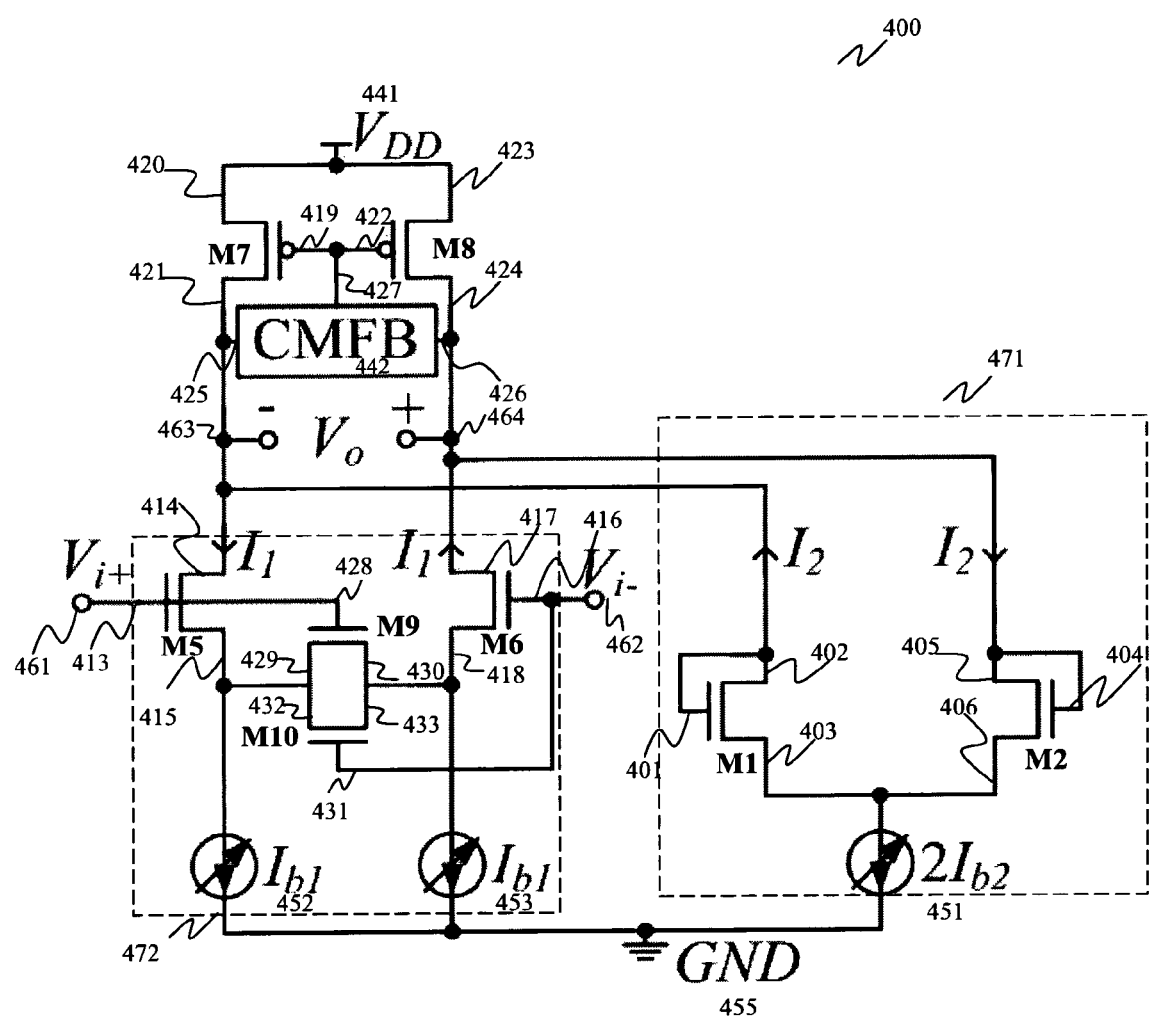
FIG. 4 shows the circuit diagram of another conventional gm-ratioed amplifier.

FIG. 4 illustrates the circuit diagram of a circuit 400 of another conventional gm-ratioed amplifier which may improve the linearity by degenerating the input stage. In this context, degenerating (or degeneration) refers to a technique where a negative feedback is applied. Upon applying a degeneration transistor or degeneration transistors at the input stage, the effective input transconductance may be reduced, and hence the gain may be reduced. This is called a degenerated amplifier.

For example, the circuit 400 of the gm-ratioed amplifier may be used in the gain cell 111 for the VGA 110 shown in FIG. 1 (a). Similarly, the circuit 400 of the gm-ratioed amplifier may be used in any of the gain cells 101 and 102 for the VGA 100 shown in FIG. 1 (b). For example, the control signal $V_c$ in FIG. 1 (a) may steer currents in the current steering circuit 113 such that a linear change in control voltage $V_c$ corresponds to an exponential change in the current ratio of currents $I_{b1}$ and $I_{b2}$ as shown in FIG. 1 (a). The currents $I_{b1}$ and $I_{b2}$ shown in FIG. 1 (a) may be mirrored to the gain cell (gm-ratioed amplifier) 111 which has a circuit 400 as shown in FIG. 4 (see the current sources 452, 453 and 451 in FIG. 4). That is, the current $I_{b1}$ may be mirrored in the current sources 452 and 453, and the current $I_{b2}$ may be mirrored in the current source 451. With an exponential change in the ratio of the currents $I_{b1}$ and $I_{b2}$ in FIG. 1, the ratio of input transconductance and load transconductance may change exponentially accordingly. As a result, a linear change in the control voltage $V_c$ may correspond to an exponential change in the gain of each of the gm-ratioed amplifiers, which is determined by the ratio of the input transconductance and load transconductance of the respective gm-ratioed amplifier.

As can be seen, the circuit 400 is quite similar to the circuit 200 as shown in FIG. 2. The field effect transistors M1, M2, M5-M8 and the CMFB 442 in FIG. 4 generally correspond to the field effect transistors M1, M2, M5-M8 and the CMFB 242 in FIG. 2, respectively. The circuit 400 comprises a first input voltage terminal 461 and a second input voltage terminal 462. The circuit 400 further comprises a first output voltage terminal 463 and a second output voltage terminal 464. The circuit 400 further comprises an amplifying unit being adapted between the input voltage terminals 461 and 462 and the output voltage terminals 463 and 464. The amplifying unit comprises an input stage and a gm-load. The input stage is the circuit part represented in the circled box 472. The gm-load is the circuit part represented in the circled box 471. The gm-load comprises a first load branch which comprises a field effect transistor M1 and a second load branch which comprises a field effect transistor M2. A gate terminal 401 and a first source/drain terminal 402 of the field effect transistor M1 are coupled with the first output voltage terminal 463. A gate terminal 404 and a first source/drain terminal 405 of the field effect transistor M2 are coupled with the second output voltage terminal 464.

The amplifying unit further comprises field effect transistors M5 and M6 in the input stage, wherein a gate 413 of the field effect transistor M5 is coupled with the first input voltage terminal 461 and a gate 416 of the field effect transistor M6 is coupled with the second input voltage terminal 462. A first source/drain terminal 414 of the field effect transistor M5 is coupled with the first output voltage terminal 463 and a first source drain terminal 417 of the field effect transistor M6 is coupled with the second output voltage terminal 464.

The circuit 400 further comprises field effect transistors M7 and M8, wherein a gate 419 of the field effect transistor M7 is coupled with a gate 422 of the field effect transistor M8, a first source/drain terminal 420 of the field effect transistor M7 and a first source/drain terminal 423 of the field effect transistor M8 are coupled with a power supply 441 ($V_{DD}$). A second source/drain terminal 421 of the field effect transistor M7 is coupled with the first output voltage terminal 463 and a second source/drain terminal 424 of the field effect transistor M8 is coupled with the second output voltage terminal 464.

The circuit 400 further comprises a common mode feedback circuit (CMFB) 442, wherein a first feedback input terminal 425 of the CMFB 442 is coupled with the first output voltage terminal 463, a second feedback input terminal 426 is coupled with the second output voltage terminal 464, and a feedback output terminal 427 of the CMFB 442 is coupled with a junction between the gate 419 of the field effect transistor M7 and the gate 422 of the field effect transistor M8.

The input stage of the circuit 400 further comprises field effect transistors M9 and M10. That is, in the input stage, a gate terminal 428 of the field effect transistor M9 is coupled to the first input voltage terminal 461 and a gate terminal 431 of the field effect transistor M10 is coupled to the second input voltage terminal 462. First source/drain terminals 429 and 432 of the field effect transistors M9 and M10 are coupled with a second source/drain terminal 415 of the field effect transistor M5, and second source/drain terminals 430 and 433 of the field effect transistors M9 and M10 are coupled to a second source/drain terminal 418 of the field effect transistor M6. The field effect transistors M9 and M10 may be referred to as input degeneration transistors. As mentioned earlier, the input degeneration transistors M9 and M10 may reduce the transconductance of the input stage, thereby reducing the gain of the gm-ratioed amplifier.

The circuit 400 further comprises a current source 451 being coupled between a ground 455 and a junction between a second source/drain terminal 403 of the field effect transistor M1 and a second source/drain terminal 406 of the field effect transistor M2. The circuit 400 further comprises a current source 452 being coupled between the ground 455 and a second source/drain terminal 415 of the field effect transistor M5, and a current source 453 being coupled between the ground 455 and a second source/drain terminal 418 of the field effect transistor M6. The field effect transistors M7 and M8 may be P-channel field effect transistors. For example, the current through the current sources 452 and 453 may be mirrored from the current $I_{b1}$ from the current steering circuit 113 (see FIG. 1 (a)), and the current through the current source 451 may be mirrored from the current $I_{b2}$ from the current steering circuit 113 (see FIG. 1 (a)). For example, the transistors M7 and M8 may be P-channel metal oxide semiconductor field effect transistors (PMOSFET). The field effect transistors M1, M2, M5, M6, M9 and M10 may be N-channel metal oxide semiconductor field effect transistors (NMOSFET).

As can be seen from the circuit 400 in FIG. 4, by degenerating the input stage, the amplifier gain may be lowered and the input P1dB may be improved by the same factor. That is, the effective input transconductance decreases with input degeneration due to the negative feedback mechanism, and therefore the amplifier gain drops. Assuming the linearity is limited by the output, i.e. the output level at which the gain is reduced by 1 dB remains the same, the input P1dB increases due to the reduced gain (see, for example, equation (8)). Thus, typically, with input degeneration (by the transistor M9 and M10 in FIG. 4), the input P1dB is improved. However, the output P1dB cannot be improved by simply using input degeneration.

Figure 5:
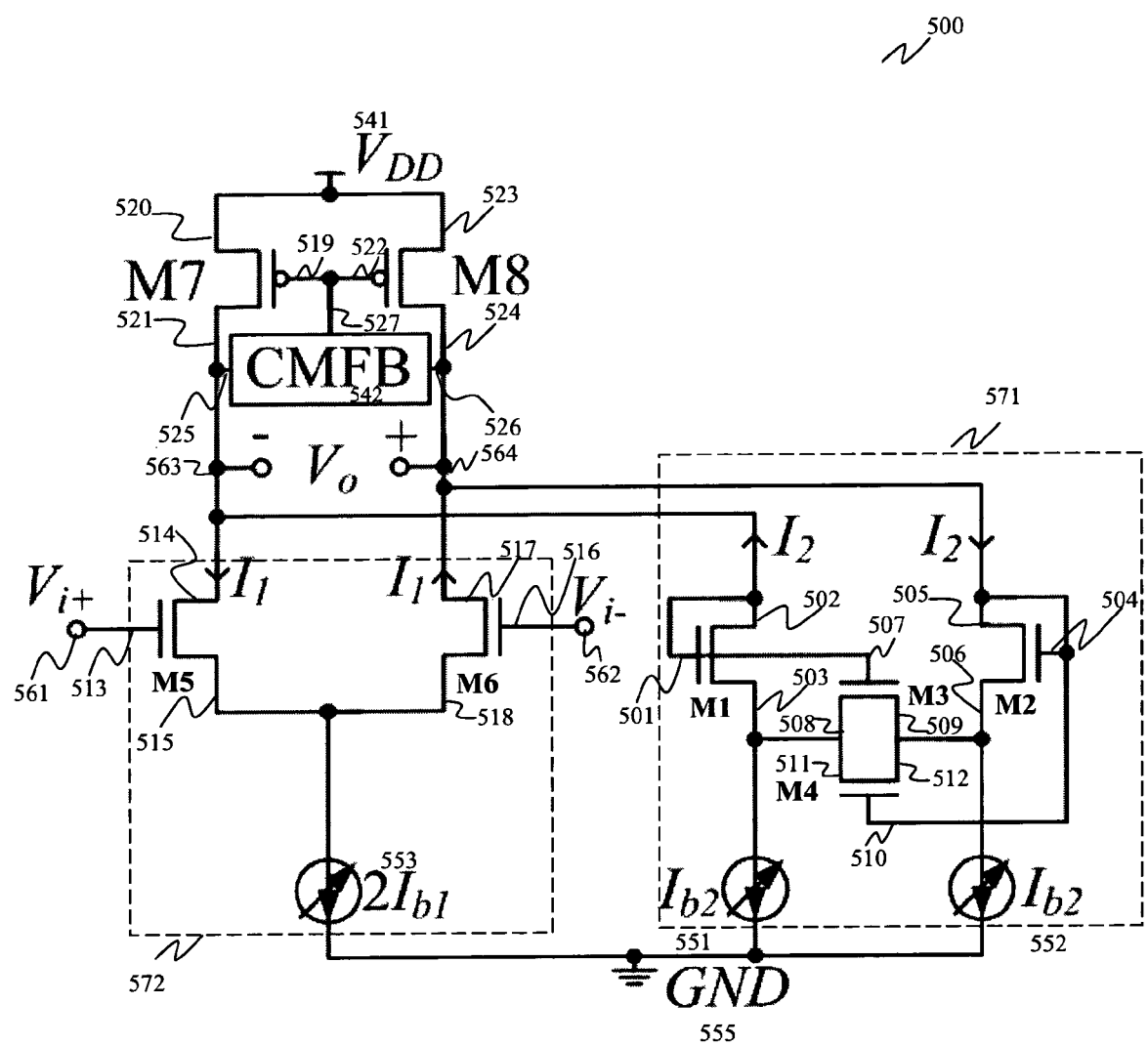
FIG. 5 shows the circuit diagram of a gm-ratioed amplifier according to one embodiment.

FIG. 5 shows a circuit diagram of the circuit 500 of a gm-ratioed amplifier according to one exemplary embodiment.

For example, the circuit 500 of the gm-ratioed amplifier may be used in the gain cell 111 shown in FIG. 1 (a). Similarly, the circuit 500 of the gm-ratioed amplifier may be used in any of the gain cells 101 and 102 shown in FIG. 1 (b). For example, the control signal $V_c$ in FIG. 1 (a) may steer currents in the current steering circuit 113 such that a linear change in control voltage $V_c$ corresponds to an exponential change in the current ratio of currents $I_{b1}$ and $I_{b2}$ as shown in FIG. 1 (a). The currents $I_{b1}$ and $I_{b2}$ shown in FIG. 1 (a) may be mirrored to the gain cell (gm-ratioed amplifiers) 111 which has a circuit 500 as shown in FIG. 5 (see the current sources 553, 551 and 552 in FIG. 5). With an exponential change in the ratio of the currents $I_{b1}$ and $I_{b2}$ in FIG. 1 (a), the ratio of input transconductance and load transconductance may change exponentially accordingly. As a result, a linear change in the control voltage $V_c$ may correspond to an exponential change in the gain of each of the gm-ratioed amplifiers which has a circuit as shown in FIG. 5, which is determined by the ratio of the input transconductance and load transconductance of the respective gm-ratioed amplifier.

The circuit 500 may comprise a first input voltage terminal 561 and a second input voltage terminal 562. An input voltage may be applied to the input voltage terminals 561 and 562. The circuit 500 may further comprise a first output voltage terminal 563 and a second output voltage terminal 564. The circuit 500 may further comprise an amplifying unit being adapted between the input voltage terminals 561 and 562 and the output voltage terminals 563 and 564. The amplifying unit may be adapted to supply an output voltage to the output voltage terminals 563 and 564 in dependence on the input voltage ($V_{i+}-V_{i-}$). The amplifying unit may comprise a gm-load. The gm-load is the part of circuit 500 represented in the circled box of 571. In one embodiment, the gm-load may comprise a first load branch which comprises a field effect transistor M1 and a second load branch which comprises a field effect transistor M2. The field effect transistors M1 and M2 may be also referred to as diode-connected load transistors. A gate terminal 501 and a first source/drain terminal 502 of the field effect transistor M1 may be coupled with the first output voltage terminal 563. A gate terminal 504 and a first source/drain terminal 505 of the field effect transistor M2 are coupled with the second output voltage terminal 564. A second source/drain terminal 503 of the field effect transistor M1 may be coupled with a second source/drain terminal 506 of the field effect transistor M2 via a first transistor arrangement such that a linearity of response of the output voltage to the input voltage may be improved. In one embodiment, transistors M1 and M2 have the same aspect ratio.

In one embodiment, the first transistor arrangement comprises field effect transistors M3 and M4 as shown in FIG. 5. The field effect transistors M3 and M4 may be also referred to as load degeneration transistors. In one embodiment, transistors M3 and M4 have the same aspect ratio. In one embodiment, the aspect ratios of the transistors M1, M2, M3, and M4 may satisfy the following relationship: $(W/L)_1=(W/L)_2=6.7\times$ $(W/L)_3=6.7\times(W/L)_4$, where $(W/L)_1$ is the aspect ratio for the transistor M1, $(W/L)_2$ is the aspect ratio for the transistor M2, $(W/L)_3$ is the aspect ratio for the transistor M3, $(W/L)_4$ is the aspect ratio for the transistor M4. The gate terminal 501 of the field effect transistor M1 may be coupled with a gate terminal 507 of the field effect transistor M3. The gate terminal 504 of the field effect transistor M2 is coupled to a gate 510 of the field effect transistor M4. A first source/drain terminal 508 of the field effect transistor M3 and a first source/drain terminal 511 of the field effect transistor M4 may be coupled with a second source/drain terminal 503 of the field effect transistor M1. A second source/drain terminal 509 of the field effect transistor M3 and a second source/drain terminal 512 of the field effect transistor M4 may be coupled to a second source/drain terminal 506 of the field effect transistor M2. In one embodiment, the load degeneration transistors M3 and M4 are configured to operate in a triode region when the gm-ratioed amplifier 500 exhibits linear behaviors.

In one embodiment, the amplifying unit in the circuit 500 may further comprise an input stage. The input stage is the circuit part represented in the circled box 572. The input stage may comprise field effect transistors M5 and M6. The field effect transistors M5 and M6 may be also referred to as input transistors. In one embodiment, the field effect transistors M5 and M6 have a same size (i.e. aspect ratio). A gate terminal 513 of the field effect transistor M5 may be coupled with the first input voltage terminal 561 and a gate 516 of the field effect transistor M6 may be coupled with the second input voltage terminal 562. A first source/drain terminal 514 of the field effect transistor M5 may be coupled with the first output voltage terminal 563. A first source drain terminal 517 of the field effect transistor M6 may be coupled with the second-output voltage terminal 564.

The circuit 500 may further comprise field effect transistors M7 and M8. The field effect transistors M7 and M8 may be also referred to as active load transistors. The field effect transistors M7 and M8 may have the same aspect ratio in one embodiment. A gate 519 of the field effect transistor M7 may be coupled with a gate 522 of the field effect transistor M8, and a first source/drain terminal 520 of the field effect transistor M7 and a first source/drain terminal 523 of the field effect transistor M8 may be coupled with a first reference voltage (e.g. power supply voltage) 541 ($V_{DD}$). A second source/drain terminal 521 of the field effect transistor M7 may be coupled with the first output voltage terminal 563, and a second source/drain terminal 524 of the field effect transistor M8 may be coupled with the second output voltage terminal 564.

The circuit 500 may further comprise a common mode feedback circuit (CMFB) 542 to regulate the output common-mode voltage. The common-mode voltage of the output signal refers to the average of the differential output signal. A first feedback input terminal 525 of the CMFB 542 may be coupled with the first output voltage terminal 563. A second feedback input terminal 526 may be coupled with the second output voltage terminal 564. A feedback output terminal 527 of the CMFB 542 may be coupled with a junction between the gate 519 of the field effect transistor M7 and the gate 522 of the field effect transistor M8.

In one embodiment, the circuit 500 may further comprise a current source 551 being coupled between a second reference voltage (e.g. a ground voltage) 555 and the second source/drain terminal 503 of the field effect transistor M1. The current source 551 may be configured to provide a first current. The circuit 500 may further comprise a current source 552 being coupled between the second reference voltage 555 and the second source/drain terminal 506 of the field effect transistor M2. The current source 552 may be configured to provide a second current. In one embodiment, the first current is the same with or approximated equal to the second current. The circuit 500 may further comprise a current source 553 being coupled between the second reference voltage 555 and a junction between a second source/drain terminal 515 of the field effect transistor M5 and a second source/drain terminal 518 of the field effect transistor M6. The current source 553 may be configured to provide a third current. The current source 551 and the current source 552 may be also referred to as the current bias block for the load. The current source 553 may be also referred to as the current bias block for the input stage. For example, the current through the current sources 553 may be mirrored from the current $I_{b1}$. From the current steering circuit 113 (see, for example, FIG. 1 (a)), and the currents through the current sources 551 and 552 may be mirrored from the current $I_{b2}$ from the current steering circuit 113 (see, for example, FIG. 1 (a)).

In one embodiment, the field effect transistors M1-M6 are N-channel field effect transistors, e.g. N-channel metal oxide semiconductor field effect transistors (NMOSFET), and the field effect transistors M7 and M8 are P-channel field effect transistors, e.g. P-channel metal oxide semiconductor field effect transistors (PMOSFET). In this embodiment, the first reference voltage is a power supply voltage and the second reference voltage is a ground voltage.

In an alternative embodiment, the field effect transistors M1-M6 are P-channel field effect transistors, e.g. P-channel metal oxide semiconductor field effect transistors (PMOSFET), and the field effect transistors M7 and M8 are N-channel field effect transistors, e.g. N-channel metal oxide semiconductor field effect transistors (NMOSFET). In this alternative embodiment, the first reference voltage is a ground voltage and the second reference voltage is a power supply voltage.

As can be seen from FIG. 5, transistors M3 and M4 play the part of degeneration, and the input stage are not degenerated. With the degeneration transistors, the load transconductance is reduced, and hence the gm-ratioed amplifier gain is increased. For this case without input degeneration, following the similar procedures as described in equations (1) to (8), one may obtain the ratio of the first and third harmonic coefficients the same as in equation (6.4) and the input and output P1dB may be subsequently obtained as $$P_{in1dB,2} = 20\log_{10}\sqrt{\left|\frac{c_1}{c_3}\right|\times 0.145} = P_{in1dB,1} \quad (9)$$

$$P_{out1dB,2} = P_{in1dB,2} + A_{v,2} = P_{in1dB,1} + A_{v,1} + h \quad (10)$$

where $P_{in1dB,2}$ represents the input P1dB for the circuit 500 and $P_{out1dB,2}$ represents the output P1dB for the circuit 500, $A_{v,2}$ is the voltage gain in dB for the circuit 500.

The extra factor h in equation (10) is attributed to the load degeneration and may have a value around 9 dB for typical degeneration settings. For a typical setting of the degeneration, the transistors M1 and M2 and the degeneration transistors M3 and M4 has a relationship in their aspect ratio $(W/L)_1=(W/L)_2=6.7\times(W/L)_3=6.7\times(W/L)_4$, where $(W/L)_1$ is the aspect ratio of the transistor M1, $(W/L)_2$ is the aspect ratio of the transistor M2, $(W/L)_3$ is the aspect ratio of the transistor M3, $(W/L)_4$ is the aspect ratio of the transistor M4.

Figure 6:
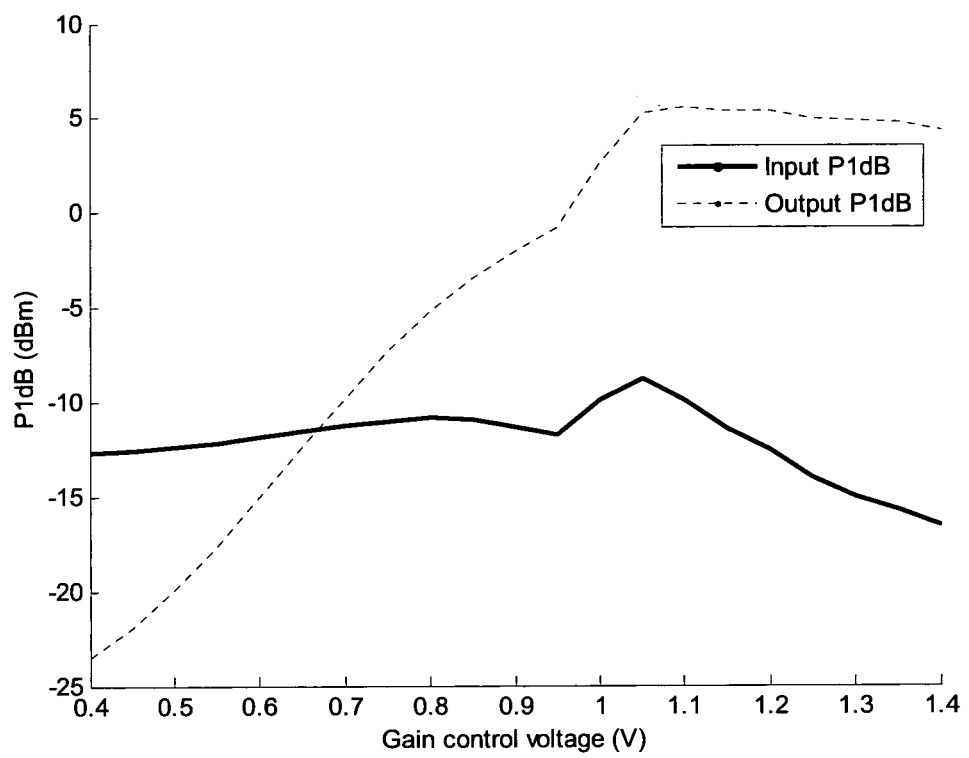
FIG. 6 shows the input P1dB and output P1dB at various gain settings for a one-stage VGA which comprises a gm-ratioed amplifier having circuit as shown in FIG. 5.

FIG. 6 shows the simulation result of the input and output P1dB of a one-stage VGA which comprises a gm-ratioed amplifier having the circuit 500 as shown in FIG. 5. The one-stage VGA may for example be the VGA shown in FIG. 1 (a). The solid line in FIG. 6 represents the input P1dB at various gain settings, and the dotted line represents the output P1dB at various gain settings. The gain setting is the gain control voltage applied to the current steering circuit, e.g. $V_c$ as shown in FIG. 1 (a), for example. As can be seen, compared with the result shown in FIG. 3 for a conventional gm-ratioed amplifier, a benefit from the load degeneration by applying the transistor arrangement comprising the transistors M3 and M4 in the gm-load as shown in FIG. 5 is that the VGA gain has been increased by a factor of h which is around 9 dB for the typical degeneration setting.

Figure 7:
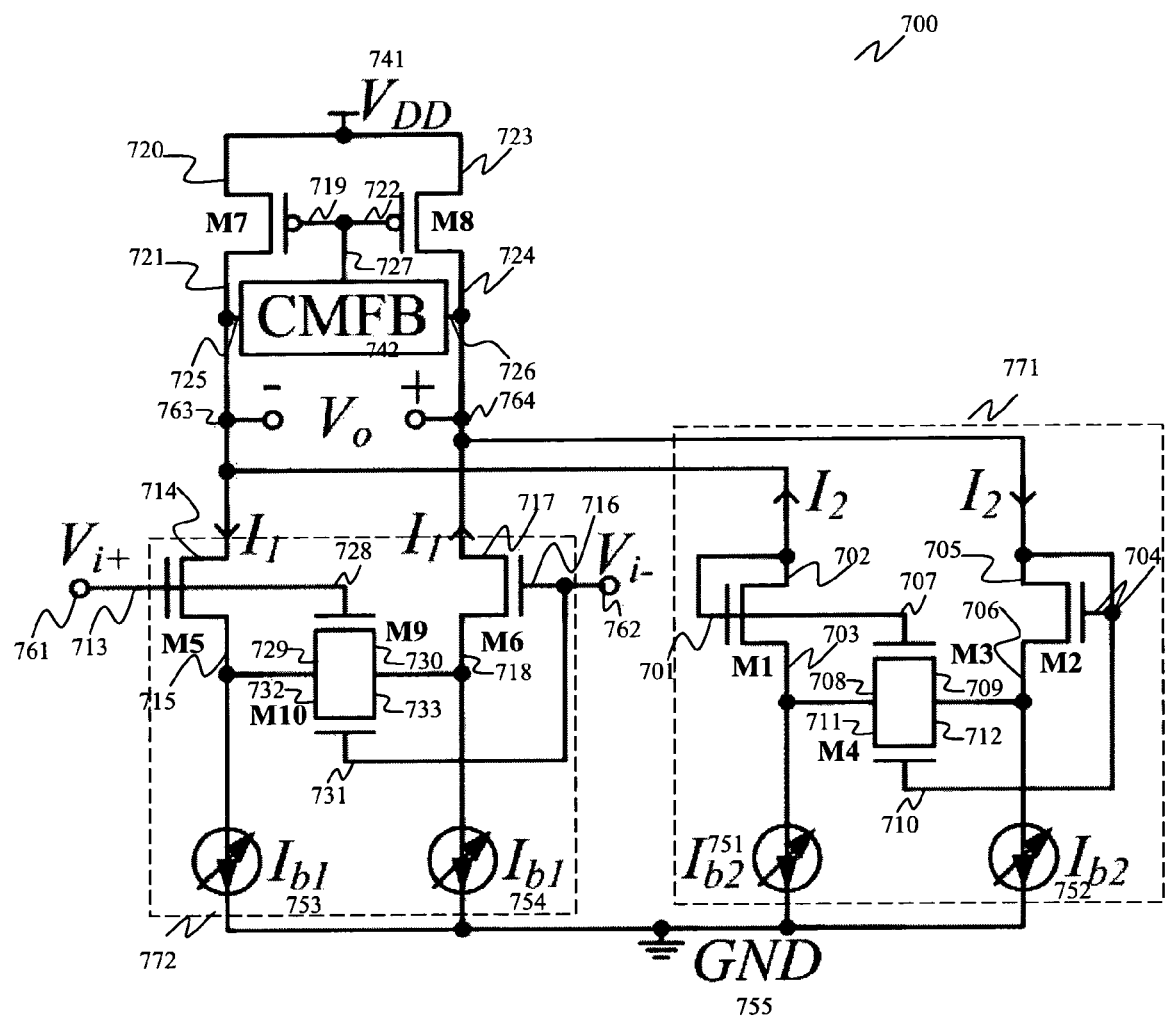
FIG. 7 shows the circuit diagram of a gm-ratioed amplifier according to one embodiment.

FIG. 7 illustrates a circuit diagram of a circuit 700 of a gm-ratioed amplifier according to one exemplary embodiment.

For example, the circuit 700 of the gm-ratioed amplifier may be used in the gain cell 111 shown in FIG. 1 (a). Similarly, the circuit 700 of the gm-ratioed amplifier may be used in any of the gain cells 101 and 102 shown in FIG. 1 (b). For example, the control signal $V_c$ in FIG. 1 (a) may steer currents in the current steering circuit 113 such that a linear change in control voltage $V_c$ corresponds to an exponential change in the current ratio of currents $I_{b1}$ and $I_{b2}$ as shown in FIG. 1 (a). The currents $I_{b1}$ and $I_{b2}$ shown in FIG. 1 (a) may be mirrored to the gain cell (gm-ratioed amplifier) 111 which has a circuit 700 as shown in FIG. 7, (see the current sources 753, 754, 751 and 752 in FIG. 7). With an exponential change in the ratio of the currents $I_{b1}$ and $I_{b2}$ in FIG. 1 (a), the ratio of input transconductance and load transconductance of the gm-ratioed amplifier may change exponentially accordingly. As a result, a linear change in the control voltage $V_c$ may correspond to an exponential change in the gain of each of the gm-ratioed amplifiers, which is determined by the ratio of the input transconductance and load transconductance of the respective gm-ratioed amplifier.

The circuit 700 may comprise a first input voltage terminal 761 and a second input voltage terminal 762. An input voltage may be applied to the input voltage terminals 761 and 762. The circuit 700 may further comprise a first output voltage terminal 763 and a second output voltage terminal 764. The circuit 700 may further comprise an amplifying unit being adapted between the input voltage terminals 761 and 762 and the output voltage terminals 763 and 764. The amplifying unit may be adapted to supply an output voltage to the output voltage terminals 763 and 764 in dependence on the input voltage. The amplifying unit may comprise a gm-load. The gm-load is the circuit part represented in the circled box 771. In one embodiment, the gm-load may comprise a first load branch which comprises a field effect transistor M1 and a second load branch which comprises a field effect transistor M2. The field effect transistors M1 and M2 may have the same aspect ratio according to one embodiment. The field effect transistors M1 and M2 may be referred to as the diode-connected load transistors. A gate terminal 701 and a first source/drain terminal 702 of the field effect transistor M1 may be coupled with the first output voltage terminal 763. A gate terminal 704 and a first source/drain terminal 705 of the field effect transistor M2 may be coupled with the second output voltage terminal 764. A second source/drain terminal 703 of the field effect transistor M1 may be coupled with a second source/drain terminal 706 of the field effect transistor M2 via a first transistor arrangement such that a linearity of the response of the output voltage to the input voltage may be improved.

In one embodiment, the first transistor arrangement in the gm-load may comprise field effect transistors M3 and M4 as shown in FIG. 7. The field effect transistors M3 and M4 may be referred to as the load degeneration transistors. In one embodiment, the load degeneration transistors M3 and M4 may have the same aspect ratio. In one embodiment, the aspect ratios of the transistors M1, M2, M3, and M4 may satisfy the following relationship: $(W/L)_1=(W/L)_2=6.7\times(W/L)_3=6.7\times(W/L)_4$, where $(W/L)_1$ is the aspect ratio for the transistor M1, $(W/L)_2$ is the aspect ratio for the transistor M2, $(W/L)_3$ is the aspect ratio for the transistor M3, $(W/L)_4$ is the aspect ratio for the transistor M4. The gate terminal 701 of the field effect transistor M1 may be coupled with a gate terminal 707 of the field effect transistor M3. The gate terminal 704 of the field effect transistor M2 may be coupled to a gate 710 of the field effect transistor M4. A first source/drain terminal 708 of the field effect transistor M3 and a first source/drain terminal 711 of the field effect transistor. M4 may be coupled with the second source/drain terminal 703 of the field effect transistor M1. A second source/drain terminal 709 of the field effect transistor M3 and a second source/drain terminal 712 of the field effect transistor M4 may be coupled to the second source/drain terminal 706 of the field effect transistor M2. In one embodiment, the load degeneration transistors M3 and M4 may be configured to operate in the triode region when the gm-ratioed amplifier 700 exhibits linear behaviors.

In one embodiment, the amplifying unit in the circuit 700 may further comprise an input stage which is the circuit part represented in the circled box 772. The input stage may comprise field effect transistors M5 and M6. The field effect transistors M5 and M6 may be also referred to as input transistors. In one embodiment, the field effect transistors M5 and M6 may have a same aspect ratio. A gate 713 of the field effect transistor M5 may be coupled with the first input voltage terminal 761. A gate 716 of the field effect transistor M6 may be coupled with the second input voltage terminal 762. A first source/drain terminal 714 of the field effect transistor M5 may be coupled with the first output voltage terminal 763. A first source drain terminal 717 of the field effect transistor M6 may be coupled with the second output voltage terminal 764.

The input stage may further comprise field effect transistors M9 and M10. The field effect transistors M9 and M10 may be also referred to as input degeneration transistors. In one embodiment, the input degeneration transistors M9 and M10 may have the same aspect ratio. In one embodiment, the transistors M5, M6, M9, and M10 may have the following aspect ratio relationship $(W/L)_5=(W/L)_6=6.7\times(W/L)_9=6.7\times(W/L)_{10}$, where $(W/L)_5$ is the aspect ratio for the transistor M5, $(W/L)_6$ is the aspect ratio for the transistor M6, $(W/L)_9$ is the aspect ratio for the transistor M9, $(W/L)_{10}$ is the aspect ratio for the transistor M10. A gate terminal 728 of the field effect transistor M9 may be coupled to the gate terminal 713 of the field effect transistor M5. A gate terminal 731 of the field effect transistor M10 may be coupled to the gate terminal 716 of the field effect transistor M6. A first source/drain terminal 729 of the field effect transistor M9 and a first source/drain terminal 732 of the field effect transistor M10 may be coupled to the second source/drain terminal 715 of the field effect transistor M5. A second source/drain terminal 730 of the field effect transistor M9 and a second source/drain terminal 733 of the field effect transistor M10 may be coupled to the second source/drain terminal 718 of the field effect transistor M6. In one embodiment, the field effect transistors M9 and M10 are configured to operate in a triode region.

The circuit 700 may further comprise field effect transistors M7 and M8. The field effect transistors M7 and M8 may be also referred to as active load transistors. A gate 719 of the field effect transistor M7 may be coupled with a gate 722 of the field effect transistor M8. The field effect transistors M7 and M8 may have a same aspect ratio. A first source/drain terminal 720 of the field effect transistor M7 and a first source/drain terminal 723 of the field effect transistor M8 may be coupled with a first reference voltage (e.g. a power supply voltage) 741 ($V_{DD}$). A second source/drain terminal 721 of the field effect transistor M7 may be coupled with the first output voltage terminal 763. A second source/drain terminal 724 of the field effect transistor M8 may be coupled with the second output voltage terminal 764.

The circuit 700 may further comprise a common mode feedback circuit (CMFB) 742 to regulate the common-mode output voltage. A first feedback input terminal 725 of the CMFB 742 may be coupled with the first output voltage terminal 763. A second feedback input terminal 726 of the CMFB 742 may be coupled with the second output voltage terminal 764. A feedback output terminal 727 of the CMFB 742 may be coupled with a junction between the gate 719 of the field effect transistor M7 and the gate 722 of the field effect transistor M8.

The circuit 700 may further comprise a current source 751 being coupled between a second reference voltage (e.g. a ground voltage) 755 and the second source/drain terminal 703 of the field effect transistor M1. The current source 751 may be configured to provide a first current. The circuit 700 may further comprise a current source 752 being coupled between the second reference voltage 755 and a second source/drain terminal 706 of the field effect transistor M2. The current source 752 may be configured to provide a second current. The current source 751 and the current source 752 may be also referred to as the current bias block for the load. In one embodiment, the first current is the same with or approximately equal to the second current.

The circuit 700 may further comprise a current source 753 being coupled between the second reference voltage 755 and the second source/drain terminal 715 of the field effect transistor M5. The current source 753 may be configured to provide a third current. The circuit 700 may further comprise a current source 754 being coupled between the second reference voltage 755 and the second source/drain terminal 718 of the field effect transistor M6. The current source 754 may be configured to provide a fourth current. The current source 753 and the current source 754 may be also referred to as the current bias block for the input stage. In one embodiment, the third current is the same with or approximately equal to the fourth current.

For example, the currents through the current sources 753 and 754 may be mirrored from the current $I_{b1}$ from the current steering circuit 113 (see FIG. 1 (a)), and the currents through the current sources 751 and 752 may be mirrored from the current $I_{b2}$ from the current steering circuit 113 (see FIG. 1 (a)).

In one embodiment, the field effect transistors M1-M6 and M9-M10 in the circuit 700 are N-channel field effect transistors, e.g. N-channel metal oxide semiconductor field effect transistors (NMOSFET), and the field effect transistors M7 and M8 in the circuit 700 are P-channel field effect transistors, e.g. P-channel metal oxide semiconductor field effect transistors (PMOSFET). In this embodiment, the first reference voltage is a power supply voltage, and the second reference voltage is a ground voltage.

In an alternative embodiment, the field effect transistors M1-M6 and M9-M10 in the circuit 700 are P-channel field effect transistors, e.g. P-channel metal oxide semiconductor field effect transistors (PMOSFET), and the field effect transistors M7 and M8 in the circuit 700 are N-channel field effect transistors, e.g. N-channel metal oxide semiconductor field effect transistors (NMOSFET). In this alternative embodiment, the first reference voltage is a ground voltage, and the second reference voltage is a power supply voltage.

In the illustrating embodiment as shown in FIG. 7, the input stage is degenerated. For the case when the input stage is degenerated as shown in FIG. 7, the input and output P1dB may be obtained as $$P_{in1dB,A} = P_{in1dB,1} + h \quad (11)$$

$$P_{out1dB,A} = P_{in1dB,A} + A_{v,A} = P_{in1dB,1} + A_{v,1} + h \quad (12)$$

where $P_{in1dB,A}$ is the input P1dB of the circuit 700, $P_{out1dB,A}$ is the output P1dB of the circuit 700, and $A_{v,A}$ is the voltage gain in dB of the circuit 700.

By degenerating both the input and load stages, one may achieve a similar gain as achieved by the gm-ratioed amplifier as shown in FIG. 2. However, both input and output P1dB are improved in this case while maintaining the VGA gain.

Figures 8, 9:
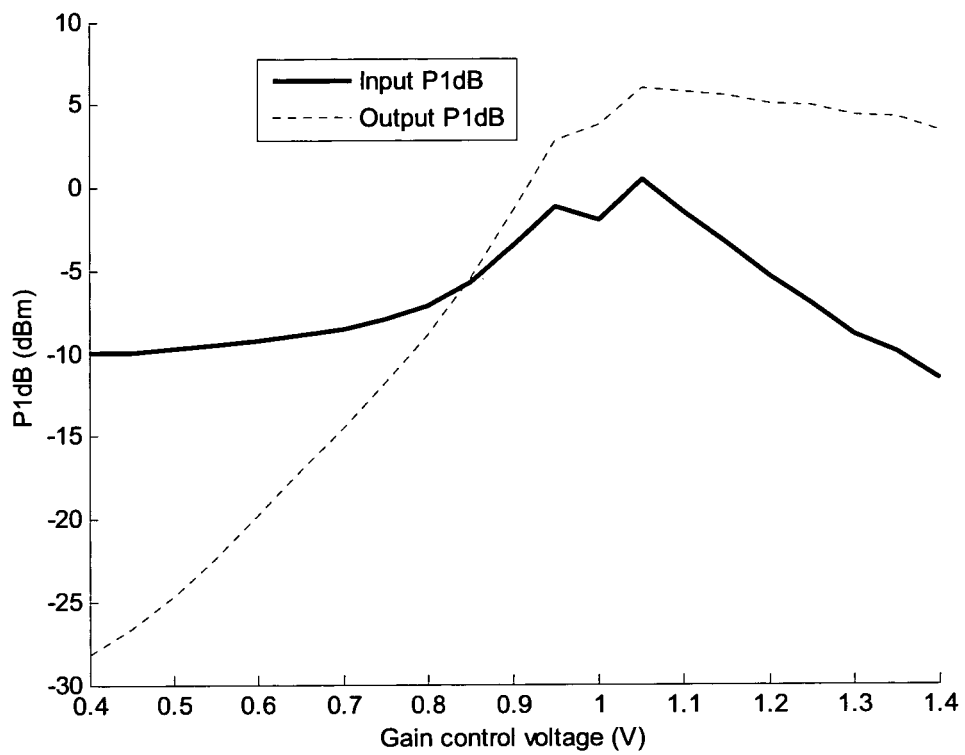
FIG. 8 shows the simulation results of the input P1dB and output P1dB at various gain settings for a one-stage VGA which comprises a gm-ratioed amplifier having circuit as shown in FIG. 7.
FIG. 9 shows a table of different kinds of VGAs that are used in the test of input P1dB as shown in FIG. 10 and in the test of output P1dB as shown in FIG. 11.

FIG. 8 illustrates the simulation results of the input and output P1dB for a one-stage VGA which comprises a gm-ratioed amplifier having both the input stage and the load being degenerated as illustrated in FIG. 7. The solid line in FIG. 8 represents the input P1dB at various gain settings, and the dotted line represents the output P1dB at various gain settings. The gain setting is the gain control voltage applied to the current steering circuit, e.g. $V_c$ as shown in FIG. 1 (a). As can be seen, compared with the result shown in FIG. 3 for a conventional gm-ratioed amplifier, both the input P1dB and the output P1dB are improved in this case while maintaining the VGA gain.

A further inspection on equation (6.4) may lead to the conclusion that at some particular gain setting through current steering of the input and load stages, the linearity may be maximized by minimizing the denominator of equation (6.4). Although the overall linearity may be limited by other circuits components such as the CMFB and the PMOS active load, a theoretical maximum may be obtained by setting the denominator of equation (6.4) to zero.

As shown in equations (10) and (12), the output P1dB may be improved by a factor around 9 dB for a typical degeneration setting. With the output linearity improvement provided by the load degeneration, the input stage may be degenerated or not degenerated (shown in FIG. 7 and FIG. 5, respectively). The former may provide a better input linearity while the latter may provide a higher gain. In contrast, as shown in equation (8), the output linearity is poor for the conventional gm-ratioed amplifier.

In one embodiment, as for the configuration of gm-ratioed amplifier with or without degeneration in the input stage or load stage, an optimum P1dB may be obtained by minimizing the denominator of equation (6.4).

The proposed linearization technique in gm-ratioed amplifier as described herein is simulated in CMOS 0.18 μm technology with 1.8V single power supply. A comparison is made between conventional gm-ratioed amplifiers and the proposed ones with load degeneration.

The kinds of VGAs each comprising a different kind of gm-ratioed amplifier are classified in the table 900 as shown in FIG. 9. The classification of VGAs in FIG. 9 (table 900) refers to VGAs, whose gain cells have different degeneration topologies. It is noted that each VGA listed in FIG. 9 may have one stage or more stages. For illustrating purpose, only the result for one-stage VGAs are shown (in FIGS. 10 and 11). The results shown in FIGS. 10 and 11 correspond to the one-stage VGAs in their respective configurations. In practice, a VGA with only one stage may satisfy the gain requirement in some applications. However, it is also understood that the gain of the one-stage VGA may not suffice in some other applications. Therefore, the number of stages of the VGA is not limited to that shown in FIGS. 1 (*a*) and (*b*), but rather depends on the specific application.

As can be seen in FIG. 9, 4 kinds of gm-ratioed amplifiers are adopted in the test. The gm-ratioed amplifier which is used for the VGA labeled as #1 is a kind of conventional gm-ratioed amplifier wherein there is no degeneration applied in either the input stage or in the gm-load. For example, the VGA #1 may be a VGA comprising a gm-ratioed amplifier which has a circuit as shown in FIG. 2. The gm-ratioed amplifier which is used for the VGA labeled as #3 is another kind of conventional gm-ratioed amplifier wherein the input stage of the VGA #3 is degenerated and the gm-load is not degenerated. For example, the VGA #3 may be a VGA comprising a gm-ratioed amplifier which has a circuit as shown in FIG. 4. The gm-ratioed amplifier which is used for the VGA labeled as #2 is according to one embodiment of the present invention wherein there in no degeneration applied in the input stage, and the gm-load is degenerated. For example, the VGA #2 may be a VGA comprising a gm-ratioed amplifier which has a circuit as shown in FIG. 5. The gm-ratioed amplifier which is used for the VGA labeled as #4 is according to one embodiment of the present invention wherein both the input stage and the gm-load are degenerated. For example, the VGA #4 may be a VGA comprising a gm-ratioed amplifier which has a circuit as shown in FIG. 7.

Figure 10:
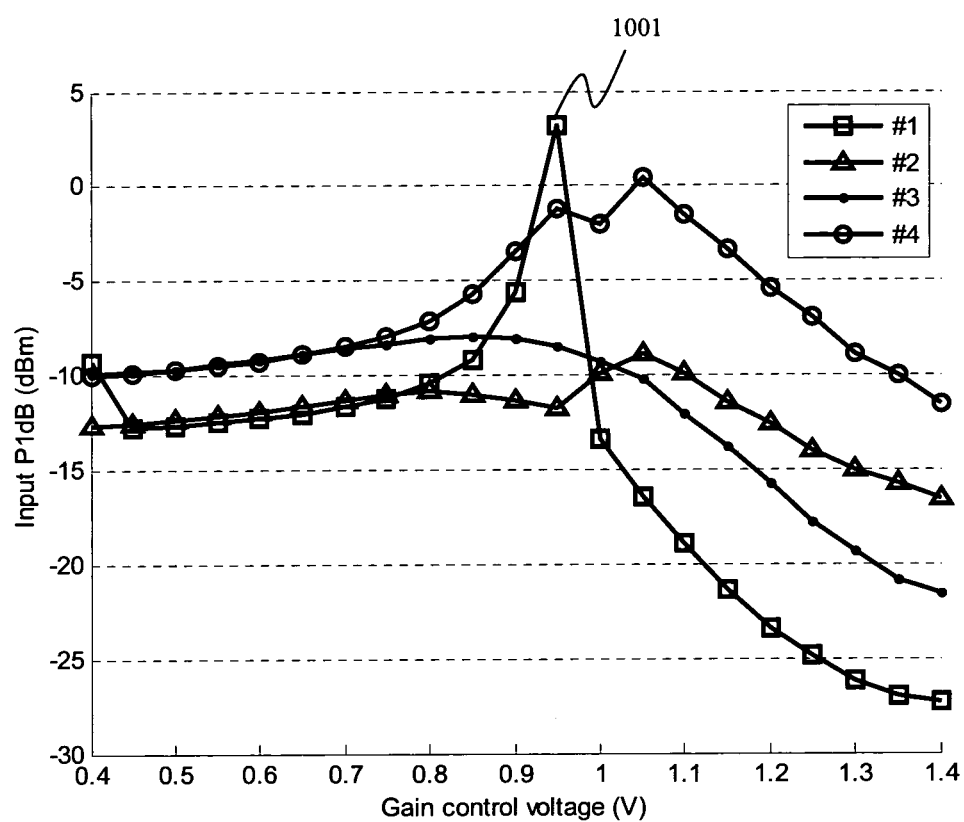
FIG. 10 shows the input P1dB at various gain settings for different kinds of VGAs as listed in FIG. 9.

FIG. 10 shows the input P1dB for different kinds (#1-#4) of one-stage VGAs as listed in the table 900 in FIG. 9. Though at one particular gain setting, the conventional VGA #1 outperforms the proposed VGA with linearization (e.g. the point 1001 in FIG. 10), over the entire gain setting, the proposed VGAs #2 and #4 achieve better input linearity over the conventional VGAs #1 and #3, as shown in FIG. 10. That is, at one particular gain setting (e.g. the point 1001 in FIG. 10), the conventional VGA #1 achieves good input linearity due to good distortion cancellation. However, over the entire gain setting, the input linearity of VGA #1 is the worst of the four VGAs. For the gain settings (gain control voltage <0.9V), the distortion is dominated by input linearity. Therefore, VGAs #3 and #4 with input degeneration have better input linearity than VGAs #1 and #2. Moreover, at high gain settings (gain control voltage >0.9V), the proposed VGA #2 outperforms VGA #3 in input linearity. This is attributed to the fact that VGA #2 applies load degeneration, resulting in higher output linearity and higher gain. The improvement in output linearity is higher than that in gain. Over the entire gain setting (except gain control voltage=0.9V), the proposed VGA #4 with both input and load degeneration have the best input linearity performance, as shown in FIG. 10. For the same input topology, improvement around 10 dB for the input P1dB may be achieved, with comparisons between VGA #1 and #2, and between #3 and #4.

Figure 11:
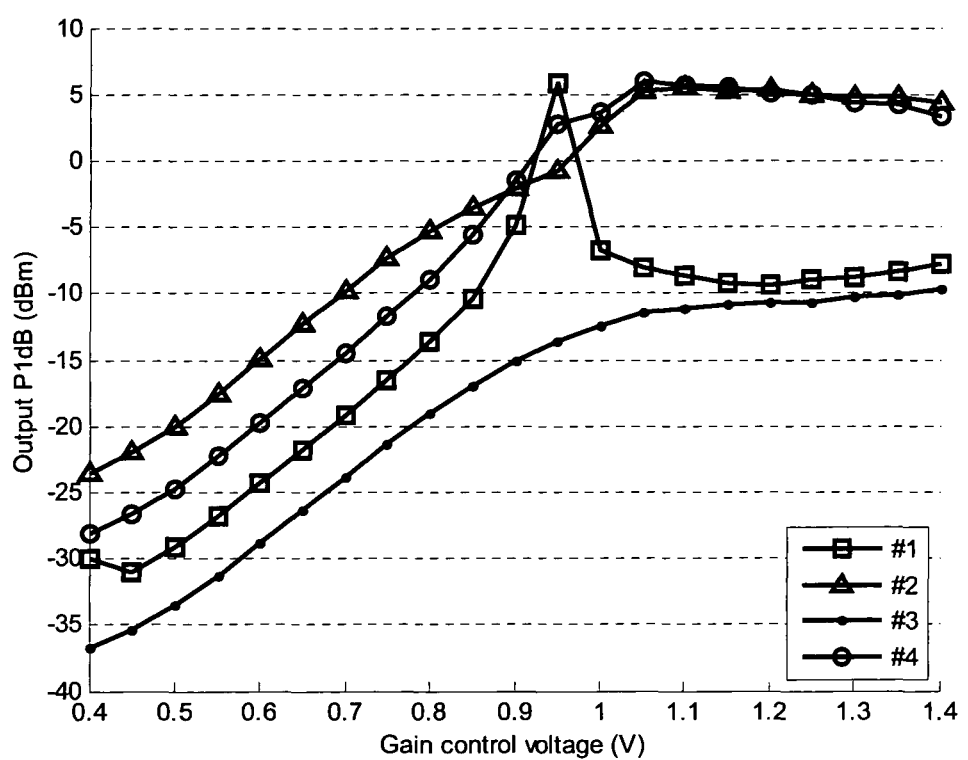
FIG. 11 shows the output P1dB at various gain settings for different kinds of VGAs as listed in FIG. 9.

FIG. 11 shows the output P1dB for different kinds (#1-#4) of one-stage VGAs as listed in the table 900 in FIG. 9. The output linearity of the proposed VGA #2 and #4 achieves better performance by around 15 dB, as compared with the conventional gm-ratioed VGA #1 and #3. That is, the application of load degeneration may improve output linearity.

A method for producing the gm-ratioed amplifier as described herein is provided. The method may comprise providing a first input voltage terminal and a second input voltage terminal. The method may further comprise providing a first output voltage terminal and a second output voltage terminal. The method may further comprise coupling an amplifying unit between the input voltage terminals and the output voltage terminals, and adapting the amplifying unit to supply an output voltage to the output terminals in dependence on an input voltage supplied to the input terminals. The amplifying unit may comprise a gm-load. The gm-load may comprise a first load branch comprising a first field effect transistor, and a second load branch comprising a second field effect transistor. A first source/drain terminal and a gate terminal of the first field effect transistor may be coupled to the first output voltage terminal. A first source/drain terminal and a gate terminal, of the second field effect transistor may be coupled to the second output voltage terminal. A second source/drain terminal of the first field effect transistor and a second source/drain terminal of the second field effect transistor may be coupled such with each other through a first transistor arrangement that a linearity of response of the output voltage to the input voltage is improved.

Conventionally, linearity improvement may be achieved by other architectures, such as feedback amplifiers. However, to achieve a comparable gain tuning range and linearity, a large amount of power needs to be consumed. The gm-ratioed amplifier as described herein achieves improvement in output linearity while maintaining the same power consumption. In addition, improvement in the input linearity or higher gain may be obtained.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A gm-ratioed amplifier, comprising:
a first input voltage terminal and a second input voltage terminal;
a first output voltage terminal and a second output voltage terminal; and
an amplifying unit being coupled between the input voltage terminals and the output voltage terminals and being adapted to supply an output voltage to the output voltage terminals in dependence on an input voltage supplied to the input terminals, wherein the amplifying unit comprises a gm-load;
the gm-load comprising a first load branch comprising a first field effect transistor, and a second load branch comprising a second field effect transistor;
wherein a first source/drain terminal and a gate terminal of the first field effect transistor is coupled to the first output voltage terminal, and wherein a first source/drain terminal and a gate terminal of the second field effect transistor is coupled to the second output voltage terminal;
wherein a second source/drain terminal of the first field effect transistor and a second source/drain terminal of the second field effect transistor are coupled with each other through a first transistor arrangement such that a linearity of response of the output voltage to the input voltage is improved.

2. The gm-ratioed amplifier according to claim 1,
wherein the first transistor arrangement comprises a third field effect transistor and a fourth field effect transistor;
wherein the gate terminal of the first field effect transistor is coupled to a gate terminal of the third field effect transistor; and
wherein the gate terminal of the second field effect transistor is coupled to a gate terminal of the fourth field effect transistor;

wherein first source/drain terminals of the third field effect transistor and the fourth field effect transistor are coupled to the second source/drain terminal of the first field effect transistor; and wherein second source/drain terminals of the third field effect transistor and the fourth field effect transistor are coupled to the second source/drain terminal of the second field effect transistor.

3. The gm-ratioed amplifier according to claim 2, wherein the amplifying unit further comprises a fifth field effect transistor and a sixth field effect transistor, wherein a gate of the fifth field effect transistor is coupled to the first input voltage terminal, and a gate of the sixth field effect transistor is coupled to the second input voltage terminal;

a first source/drain terminal of the fifth field effect transistor is coupled to the first output voltage terminal, and a first source/drain terminal of the sixth field effect transistor is coupled to the second output voltage terminal; and a second source/drain terminal of the fifth field effect transistor is coupled with a second source/drain terminal of the sixth field effect transistor.

4. The gm-ratioed amplifier according to claim 1, further comprising a first resistor having a first resistor terminal and a second resistor terminal, wherein the first resistor terminal is coupled to a first reference voltage, and wherein the second resistor terminal is coupled to the first output voltage terminal; and a second resistor having a first resistor terminal and a second resistor terminal wherein the first resistor terminal is coupled to the first reference voltage, and wherein the second resistor terminal is coupled to the second output voltage terminal.

5. The gm-ratioed amplifier according to claim 4, wherein the first resistor is a seventh field effect transistor having a first source/drain terminal being coupled to the first reference voltage, and having a second source/drain terminal being coupled to the first output voltage terminal; and the second resistor is an eighth field effect transistor having a first source/drain terminal being coupled to the first reference voltage, and having a second source/drain terminal being coupled to the second output voltage terminal.

6. The gm-ratioed amplifier according to claim 5, wherein a gate of the seventh field effect transistor is coupled to a gate of the eighth field effect transistor.

7. The gm-ratioed amplifier according to claim 6, further comprising a common-mode feedback circuit having a first feedback input terminal being coupled to the first output voltage terminal, having a second feedback input terminal being coupled to the second output voltage terminal, and having a feedback output terminal being coupled to a junction between the gates of the seventh and eighth field effect transistors.

8. The gm-ratioed amplifier according to claim 1, wherein the first load branch of the gm-load further comprises a first current source being coupled between a second reference voltage and the second source/drain terminal of the first field effect transistor, wherein the first current source is configured to provide a first current; and the second load branch of the gm-load further comprises a second current source being coupled between the second reference voltage and the second source/drain terminal of the second field effect transistor, wherein the second current source is configured to provide a second current.

9. The gm-ratioed amplifier according to claim 8, wherein the first current is approximately equal to the second current.

10. The gm-ratioed amplifier according to claim 3, wherein the amplifying unit further comprises a current source being coupled between a second reference voltage and a junction of the second source/drain terminals of the fifth and sixth field effect transistors, wherein the current source is configured to provide a current.

11. The gm-ratioed amplifier according to claim 3, wherein the second source/drain terminal of the fifth field effect transistor is coupled with the second source/drain terminal of the sixth field effect transistor through a second transistor arrangement, wherein the second transistor arrangement comprises a seventh field effect transistor and an eighth field effect transistor, wherein the gate terminal of the fifth field effect transistor is coupled to a gate terminal of the seventh field effect transistor;

the gate terminal of the sixth field effect transistor is coupled to a gate terminal of the eighth field effect transistor;

first source/drain terminals of the seventh field effect transistor and the eighth field effect transistor are coupled to the second source/drain terminal of the fifth field effect transistor; and second source/drain terminals of the seventh field effect transistor and the eighth field effect transistor are coupled to the second source/drain terminal of the sixth field effect transistor.

12. The gm-ratioed amplifier according to claim 11, wherein the amplifying unit further comprises a first current source being coupled between a second reference voltage and the second source/drain terminal of the fifth field effect transistor, wherein the first current source is configured to provide a first current; and a second current source being coupled between the second reference voltage and the second source/drain terminal of the sixth field effect transistor, wherein the second current source is configured to provide a second current.

13. The gm-ratioed amplifier according to claim 12, wherein the first current is approximately equal to the second current.

14. The gm-ratioed amplifier according to claim 3, wherein the first through the sixth field effect transistors are N-channel field effect transistors.

15. The gm-ratioed amplifier according to claim 5, wherein the seventh and the eighth field effect transistors are P-channel field effect transistors.

16. The gm-ratioed amplifier according to claim 11, wherein the seventh and the eighth field effect transistors are N-channel field effect transistors.

17. The gm-ratioed amplifier according to claim 1, wherein the first field effect transistor and the second field effect transistor have approximately the same aspect ratio.

18. The gm-ratioed amplifier according to claim 2, wherein the third field effect transistor and the fourth field effect transistor have approximately the same aspect ratio.

19. The gm-ratioed amplifier according to claim 2, wherein the third and the fourth field effect transistors are configured to operate in a triode region.

20. The gm-ratioed amplifier according to claim 11, wherein the seventh and the eighth field effect transistors have approximately the same aspect ratio.

21. The gm-ratioed amplifier according to claim 11, wherein the seventh and the eighth field effect transistors are configured to operate in a triode region.

* * * * *